United States Patent
Kwak

(10) Patent No.: US 8,942,046 B2
(45) Date of Patent: Jan. 27, 2015

(54) METHOD OF PROGRAMMING A 3-DIMENSIONAL NONVOLATILE MEMORY DEVICE BASED ON A PROGRAM ORDER OF A SELECTED PAGE AND A LOCATION OF A STRING SELECTION LINE

(71) Applicant: Donghun Kwak, Hwaseong-si (KR)

(72) Inventor: Donghun Kwak, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 76 days.

(21) Appl. No.: 13/761,196

(22) Filed: Feb. 7, 2013

(65) Prior Publication Data

US 2013/0286747 A1 Oct. 31, 2013

(30) Foreign Application Priority Data

Apr. 26, 2012 (KR) ........................ 10-2012-0043887

(51) Int. Cl.
| | | |
|---|---|---|
| *G11C 16/12* | (2006.01) | |
| *G11C 16/10* | (2006.01) | |
| *G11C 16/34* | (2006.01) | |
| *G11C 11/56* | (2006.01) | |
| *G11C 16/04* | (2006.01) | |
| *H01L 27/115* | (2006.01) | |

(52) U.S. Cl.
CPC .............. *G11C 16/10* (2013.01); *G11C 16/34* (2013.01); *G11C 11/5628* (2013.01); *G11C 11/5642* (2013.01); *G11C 16/0483* (2013.01); *G11C 16/3427* (2013.01); *H01L 27/115* (2013.01); *H01L 27/11556* (2013.01); *H01L 27/11582* (2013.01); *G11C 2211/5621* (2013.01)

USPC .......... 365/185.19; 365/185.18; 365/185.22; 365/185.17; 365/185.12

(58) Field of Classification Search
USPC ............. 365/185.12, 185.13, 185.11, 185.17, 365/185.19, 185.18, 185.22
See application file for complete search history.

(56) References Cited

U.S. PATENT DOCUMENTS

| | | | | |
|---|---|---|---|---|
| 5,524,094 | A * | 6/1996 | Nobukata et al. ........ | 365/185.21 |
| 5,969,990 | A * | 10/1999 | Arase ....................... | 365/185.25 |
| 6,717,861 | B2 * | 4/2004 | Jeong et al. .............. | 365/185.28 |
| 7,508,705 | B2 | 3/2009 | Chae et al. | |
| 7,633,803 | B2 | 12/2009 | Lee | |
| 7,706,188 | B2 * | 4/2010 | Kim ......................... | 365/185.17 |
| 7,924,629 | B2 | 4/2011 | Park et al. | |

(Continued)

FOREIGN PATENT DOCUMENTS

| | | |
|---|---|---|
| KR | 1020050108148 A | 11/2005 |
| KR | 1020060101898 A | 9/2006 |

(Continued)

*Primary Examiner* — Andrew Q Tran
(74) *Attorney, Agent, or Firm* — Volentine & Whitt, PLLC

(57) ABSTRACT

A nonvolatile memory device comprises cell strings formed in a direction substantially perpendicular to a substrate and is configured to select memory cells in units corresponding to a string selection line. The device selects a page to be programmed among pages sharing a common word line, determines a level of a program voltage to be provided to the selected page according to a location of a string selection line corresponding to the selected page, and writes data in the selected page using the determined level of the program voltage.

7 Claims, 22 Drawing Sheets

(56) References Cited

U.S. PATENT DOCUMENTS

| | | |
|---|---|---|
| 8,004,885 B2 | 8/2011 | Yun et al. |
| 8,174,890 B2 | 5/2012 | Maeda et al. |
| 8,189,391 B2 | 5/2012 | Itagaki et al. |
| 2010/0020617 A1 | 1/2010 | Oh et al. |
| 2010/0214838 A1 | 8/2010 | Hishida et al. |
| 2011/0161571 A1 | 6/2011 | Kim et al. |
| 2011/0199804 A1 | 8/2011 | Son et al. |

FOREIGN PATENT DOCUMENTS

| | | |
|---|---|---|
| KR | 100771882 B1 | 10/2007 |
| KR | 1020080099693 A | 11/2008 |
| KR | 1020090072406 A | 7/2009 |
| KR | 1020090106869 A | 10/2009 |
| KR | 1020110075312 A | 7/2011 |
| KR | 1020110094985 A | 8/2011 |

* cited by examiner

METHOD OF PROGRAMMING A 3-DIMENSIONAL NONVOLATILE MEMORY DEVICE BASED ON A PROGRAM ORDER OF A SELECTED PAGE AND A LOCATION OF A STRING SELECTION LINE

CROSS-REFERENCE TO RELATED APPLICATIONS

This application claims priority under 35 U.S.C. §119 to Korean Patent Application No. 10-2012-0043887 filed on Apr. 26, 2012, the subject matter of which is hereby incorporated by reference.

BACKGROUND OF THE INVENTION

The inventive concept relates generally to electronic memory technologies. More particularly, certain embodiments of the inventive concept relate to nonvolatile memory devices and related methods of operation.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include static random access memory (SRAM) and dynamic random access memory (DRAM). Examples of nonvolatile memory devices include masked read-only memory (MROM), programmable ROM (PROM), erasable programmable ROM (EPROM), and electrically erasable programmable ROM (EEPROM).

Flash memory is a popular form of EEPROM that can be found in a wide variety of modern electronic devices, such as computers, cellular phones, a personal digital assistants (PDAs), digital cameras, camcorders, voice recorders, MP3 players, handheld PCs, gaming machines, facsimile machines, scanners, and printer, to name but a few. The popularity of flash memory can be attributed to a variety of features, such as its relatively high storage capacity, performance, and durability, as well as its relatively low power consumption and cost.

In an effort to provide even better performance, storage capacity, and so on, researchers continue to devote significant resources to the further development of flash memory technology. One example of this further development is the introduction of flash memory devices comprising memory cells formed in three-dimensional (3D) arrays. These devices have the potential for significantly greater storage capacity and performance compared with flash memory devices where memory cells are formed in two-dimensional (2D) arrays. Nevertheless, the development of the 3D array technology has presented a number of technical challenges and opportunities to be addressed through ongoing innovation.

SUMMARY OF THE INVENTION

In one embodiment of the inventive concept, a method is provided for operating a nonvolatile memory device comprising cell strings formed in a direction substantially perpendicular to a substrate and configured to select memory cells in units corresponding to a string selection line. The method comprises selecting a page to be programmed among pages sharing a common word line, determining a level of a program voltage to be provided to the selected page according to a location of a string selection line corresponding to the selected page, and writing data in the selected page using the determined level of the program voltage.

In another embodiment of the inventive concept, a nonvolatile memory device comprises a memory cell array comprising a plurality of pages corresponding to different string selection lines and sharing a common word line, a voltage generator configured to generate voltages to be provided to the memory cell array, and control logic configured to control the memory cell array and the voltage generator. The control logic determines a program order of a selected page among the plurality of pages according to a location of a string selection line corresponding to the selected page and determines a level of a voltage to be provided to the selected page according to a program order of the selected page.

In another embodiment of the inventive concept, a method is provided for operating a nonvolatile memory device comprising a memory cell array comprising a plurality of pages corresponding to different string selection lines and sharing a common word line. The method comprises determining a program order of a selected page among the plurality of pages according to a location of a string selection line corresponding to the selected page, and determining a level of a voltage to be provided to the selected page according to a program order of the selected page.

These and other embodiments of the inventive concept can potentially improve the performance and reliability of nonvolatile memory devices by addressing the effects of electrical disturbances between different memory cells.

BRIEF DESCRIPTION OF THE DRAWINGS

The drawings illustrate selected embodiments of the inventive concept. In the drawings, like reference numbers indicate like features and the relative sizes of some features may be exaggerated for clarity of illustration.

DETAILED DESCRIPTION

Figure 1:
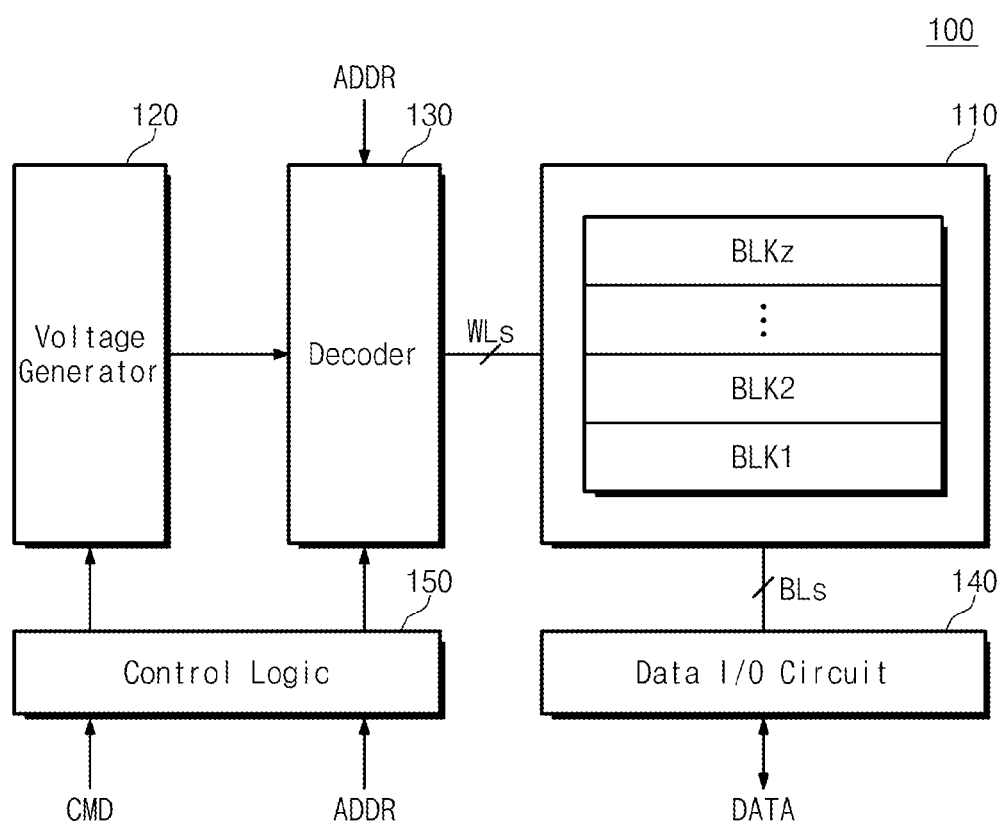
FIG. 1 is a block diagram of a nonvolatile memory device according to an embodiment of the inventive concept.

Embodiments of the inventive concept are described below with reference to the accompanying drawings. These embodiments are presented as teaching examples and should not be construed to limit the scope of the inventive concept.

In the description that follows, the terms "first", "second", "third", etc., may be used to describe various features, but the described features should not be limited by these terms. Rather, these terms are used merely to distinguish between different features. Thus, a first feature could alternatively be termed a second feature and vice versa without materially altering the meaning of the relevant description.

Spatially relative terms, such as "beneath", "below", "lower", "under", "above", "upper" and the like, may be used for ease of description to describe spatial relationships between different features as illustrated in the drawings. The spatially relative terms are intended to encompass different orientations of the device in use or operation in addition to the orientation depicted in the drawings. For example, if a device as shown in the drawings is turned over, features described as "below" or "beneath" or "under" other features would then be oriented "above" the other features. Thus, the terms "below" and "under" can encompass both an orientation of above and below. The device may be otherwise oriented (rotated 90 degrees or at other orientations) and the spatially relative descriptors used herein interpreted accordingly. In addition, where a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to encompass the plural forms as well, unless the context clearly indicates otherwise. Terms such as "comprises," "comprising," "includes," "including," etc., where used in this specification, indicate the presence of stated features but do not preclude the presence or addition of other features. The term "and/or" indicates any and all combinations of one or more of the associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the present specification and should not be interpreted in an idealized or overly formal sense unless expressly so defined herein.

FIG. 1 is a block diagram of a nonvolatile memory device 100 according to an embodiment of the inventive concept.

Referring to FIG. 1, nonvolatile memory device 100 comprises a memory cell array 110, a voltage generator 120, a decoder 130, a data input/output circuit 140, and control logic 150.

Memory cell array 110 is connected with decoder 130 via word lines. Memory cell array 110 may be connected with data input/output circuit 140 via bit lines. Memory cell array 110 comprises a plurality of memory blocks BLK1 to BLKz each comprising a plurality of NAND cell strings. The NAND cell strings can be selected by a plurality of string selection lines.

Channels of the NAND cell strings are formed in a vertical direction. In memory cell array 110, a plurality of word lines are stacked in a vertical direction, and channels of the NAND cell strings are formed in a vertical direction. A memory device having the above-described structure may be referred to as a vertical or 3D nonvolatile memory device. Each of the memory cells of memory cell array 110 may be used as a single-level cell (SLC) or a multi-level cell (MLC).

Voltage generator 120 generates voltages to be provided to decoder 130 under control of control logic 150. In a program operation, voltage generator 120 generates word line voltages such as a program voltage Vpgm, a program verification voltage Vfy, a pass voltage, and the like in response to the control of control logic 150, and provides the word line voltages to decoder 130. In a read operation, voltage generator 120 generates word line voltages such as a selection read voltage Vr, a non-selection read voltage Vread, and the like in response to the control of control logic 150, and provides the word line voltages to decoder 130.

Decoder 130 selects one of a plurality of pages of memory cell array 110 in response to an address ADDR input from an external device and the control of control logic 150. Decoder 130 provides the selected page with the word line voltages from voltage generator 120. More specifically, decoder 130 selects one of the memory blocks in memory cell array 110 in response to address ADDR. Decoder 130 also selects a string selection line and a word line in the selected memory block in response to address ADDR. The word line is connected to a selected page of memory cells. Accordingly, the selected page is selected based on the selected string selection line and word line.

In a program operation, decoder 130 selects one page to transfer a program voltage Vpgm and a program verification voltage Vfy to the selected word line connected to the selected page. Decoder 130 provides an unselected word line with a pass voltage Vpass. In a read operation, decoder 130 selects one page to transfer a selection read voltage Vr to a selected word line including the selected page. Decoder 130 provides an unselected word line with a non-selection read voltage Vread.

Data input/output circuit 140 receives data from an external device and transfers the received data to memory cell array 110. Data input/output circuit 140 also reads data from memory cell array 110 and transfers the read data to the external device. Data input/output circuit 140 typically comprises features such as a column gating circuit, a page buffer, data buffer, and the like. Alternatively, data input/output circuit 140 may comprise features such as a column gating circuit, a write driver, a sense amplifier, or a data buffer.

Control logic 150 controls overall operations of nonvolatile memory device 100 in response to a command CMD and an address ADDR from an external device. For example, control logic 150 may receive a program command and an address to control a program operation of nonvolatile memory device 100. Alternatively, control logic 150 may receive a read command and an address to control a read operation of nonvolatile memory device 100.

In some embodiments, nonvolatile memory device 100 uses an adjusted program scheme according to a program sequence of a selected page. In the adjusted program scheme, a threshold voltage distribution of each page is formed to have a sufficient read margin. For instance, in a program operation, control logic 150 may determine an order to be programmed with respect to a selected one of pages which share the same word line and correspond to different string selection lines. Control logic 150 may control voltage generator 120 such that program voltages Vpgm or pass voltages Vpass having different voltage levels are generated, according to a program order of a selected page. As a voltage level is adjusted according to a program order of a selected page, a threshold voltage distribution of each page may be formed to have a sufficient read margin.

In some embodiments, nonvolatile memory device 100 uses an adjusted read scheme according to a program sequence of a selected page. In the adjusted program scheme, programmed pages may have different threshold voltage distributions. Nonvolatile memory device 100 may use an adjusted read scheme according to a threshold voltage distribution of each page. For example, in a program operation, control logic 150 may determine a programmed order of a page to be read from among pages which share the same word line and correspond to different string selection lines. Control logic 150 may control voltage generator 120 such that selection read voltages Vr and/or non-selection read voltages Vread having different voltage levels are generated, according to a programmed order of a page to be read. As a voltage level is adjusted according to a programmed order of a selected page, nonvolatile memory device 100 may prevent read fail.

Figure 2:
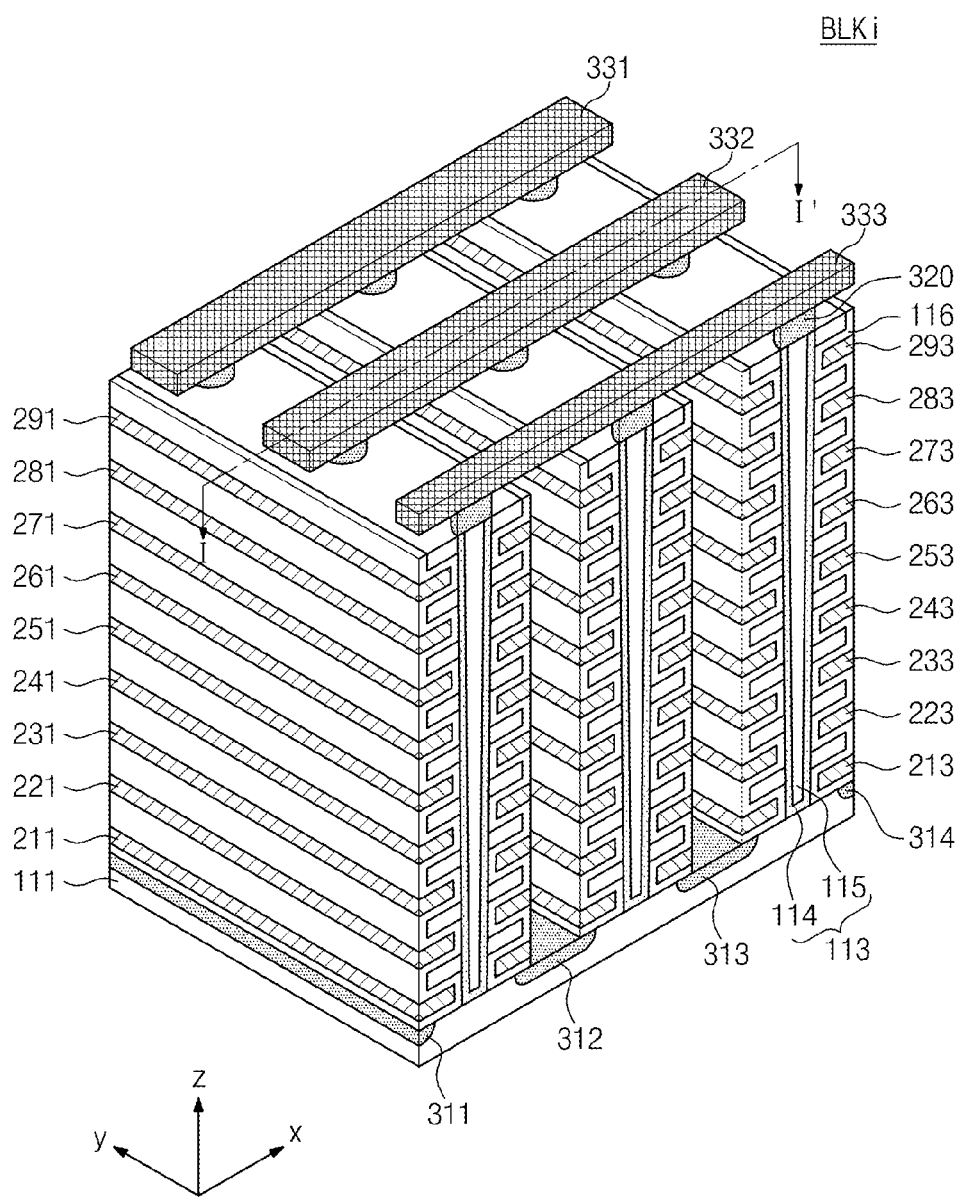
FIG. 2 is a perspective view of a memory block shown in FIG. 1 according to an embodiment of the inventive concept.

FIG. 2 is a perspective view illustrating a memory block shown in FIG. 1 according to an embodiment of the inventive concept.

Referring to FIG. 2, a memory block BLKi comprises cell strings formed with a 3D or vertical structure. Memory block BLKi comprises structures extending along a plurality of directions x, y, and z.

Memory block BLKi comprises a substrate 111. Substrate 111 is formed of a p-well in which a Group V element such as boron is injected, for example. Alternatively, substrate 111 may be a pocket p-well provided within an n-well. In the following description, it is assumed that substrate 111 is a p-well, although it is not limited to a p-well.

Doping regions 311 to 314 extending along the direction x are formed in substrate 111. For example, doping regions 311 to 314 may be formed of n-type conductors different from substrate 111. In the following description, it is assumed that first to third doping regions 311 to 314 are n-type. However, first to third doping regions 311 to 314 are not limited to n-type.

On substrate 111 between first and second doping regions 311 and 312, a plurality of insulation materials 112 extending along the y-direction are formed sequentially along the z-direction. Insulation materials 112 can be formed to be spaced apart along the z-direction. In some embodiments, insulation materials 112 comprise an insulation material such as silicon oxide.

On substrate 111 between the first and second doping regions 311 and 312, a plurality of pillars 113 are arranged sequentially along the y-direction so as to penetrate insulation materials 112 along the z-direction. For example, pillars 113 may contact with substrate 111 through insulation materials 112. Herein, pillar 113 may be formed both on substrate 111 between second and third doping regions 312 and 313 and on the substrate between third and fourth doping regions 313 and 314.

In some embodiments, each pillar 113 may be formed of a plurality of materials. For example, a surface layer 114 of each pillar 113 may comprise a first type of silicon material having the same type as substrate 111. Below, it is assumed that surface layer 114 of each pillar 113 includes p-type silicon. However, surface layer 114 of each pillar 113 is not limited to p-type silicon.

An inner layer 115 of each pillar 113 is formed of an insulation material. For example, inner layer 115 of each pillar 113 comprises an insulation material such as silicon oxide. For example, inner layer 115 of each pillar 113 may comprise an air gap.

An insulation film 116 is provided between first and second doping regions 311 and 312 along exposed surfaces of insulation materials 112, pillars 113, and substrate 111. In some embodiments, insulation film 116 can be removed which is provided on an exposed surface (toward the z-direction) of last insulation material 112 provided along the z-direction.

At a region between the first and second doping regions 311 and 312, first conductive materials 211 to 291 are provided on an exposed surface of insulation film 116. For example, first conductive material 211 extending along the y-direction is provided between substrate 111 and an insulation material 112 adjacent to substrate 111. First conductive material 211 extending in the x-direction is provided between substrate 111 and an insulation film 116 of a lower surface of insulation material 112 adjacent to substrate 111.

The first conductive material extending along the y-direction is provided between insulation film 116 of an upper surface of a specific insulation material of insulation materials 112 and insulation film 116 of a lower surface of an insulation material disposed at an upper portion of the specific insulation material. In some embodiments, first conductive materials 211 to 291 comprise a metal material. In some embodiments, first conductive materials 211 to 291 comprise a conductive material such as polysilicon.

The same structure as that on the first and second doping regions 311 and 312 is provided at an area between the second and third doping regions 312 and 313. For example, at an area between the second and third doping regions 312 and 313 are insulation materials 112 extending in the y-direction, pillars 113 disposed sequentially along the y-direction to penetrate insulation materials 113 along the x-direction, an insulation film 116 provided on exposed surfaces of plurality of pillars 113 and insulation materials 112, and a plurality of first conductive materials 212 to 292 extending along the y-direction.

The same structure as that on first and second doping regions 311 and 312 is provided at an area between third and fourth doping regions 313 and 314. For example, at an area between third and fourth doping regions 313 and 314 are insulation materials 112 extending in the y-direction, pillars 113 disposed sequentially along the y-direction to penetrate insulation materials 113 along the z-direction, an insulation film 116 provided on exposed surfaces of plurality of pillars 113 and insulation materials 112, and conductive materials 213 to 293 extending along the y-direction.

Drains 320 may be provided on pillars 113, respectively. Second conductive materials 331 to 333 extending along the x-direction may be provided on drains 320. Second conductive materials 331 to 333 may be arranged sequentially along the y-direction. Second conductive materials 331 to 333 may be connected with drains 320 of corresponding regions, respectively. In some embodiments, drains 320 and second conductive material 333 extending in the x-direction may be connected via contact plugs, respectively. In some embodiments, second conductive materials 331 to 333 may be metallic materials. Alternatively, second conductive materials 331 to 333 may be conductive materials such as polysilicon.

Figure 3:
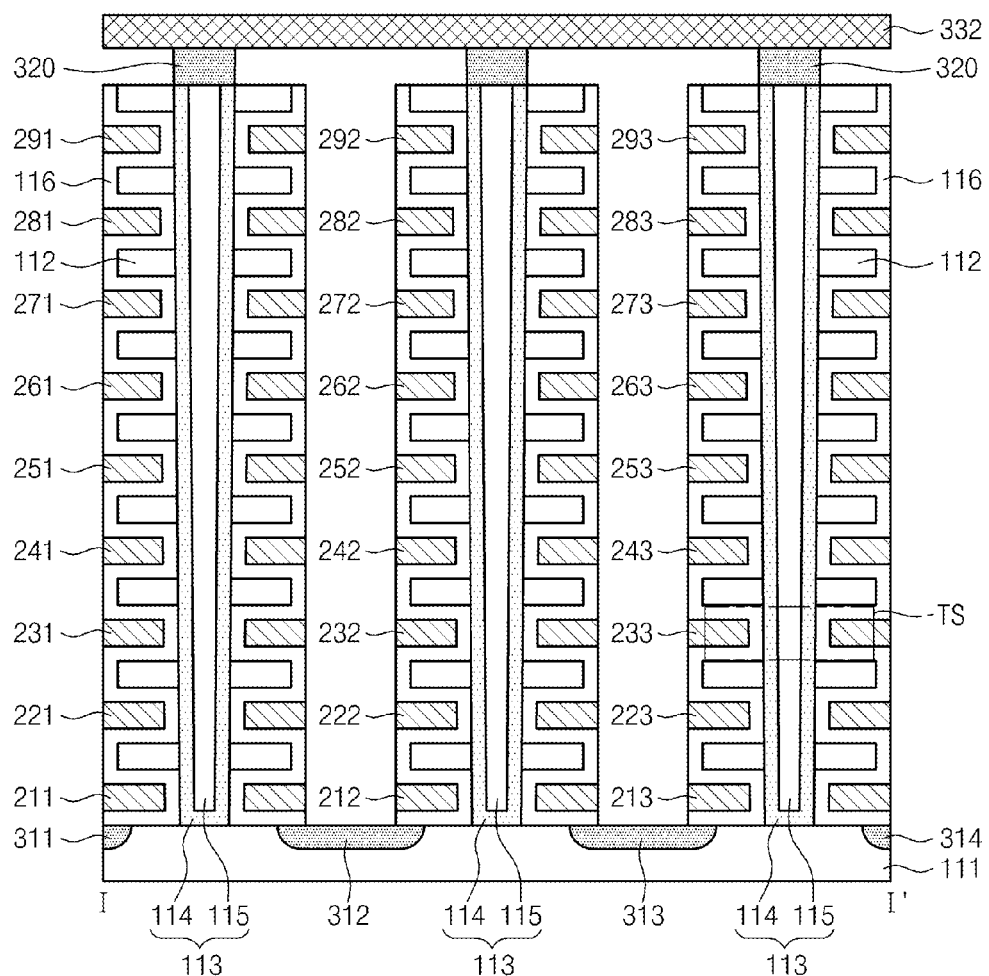
FIG. 3 is a cross-sectional view taken along a line I-I' in FIG. 2.

FIG. 3 is a cross-sectional view illustrating a vertical NAND cell string in FIG. 2. Referring to FIG. 3, a cell string comprises memory cells which are formed around a pillar connected with a bit line. For ease of description, it is assumed that a cell string includes seven memory cells.

A pillar PL may be formed between first and second doping regions 311 and 312 to penetrate insulation materials 112 along a z-direction. Pillar PL may contact with a substrate 111 via insulation materials 112. Pillar PL comprises a channel film 114 and an inner material 115.

Channel film 114 comprises a semiconductor material (e.g., silicon) having the first conductive type. For example, channel film 114 comprises a semiconductor material (e.g., silicon) having the same conductive type as substrate 111. Below, it is assumed that channel film 114 includes p-type silicon. However, the inventive concept is not limited thereto. For example, channel film 114 comprises intrinsic semiconductor being a non-conductive characteristic.

Inner material 115 comprises an insulation material. For example, inner material 115 comprises an insulation material such as silicon oxide. For example, inner material 115 comprises air gap.

Information storage films 116 may be provided on exposed surfaces of insulation materials 112 and pillar PL between the first and second doping regions 311 and 312. Conductive materials may be provided on exposed surfaces of insulation storage films 116 between adjacent doping regions 311 and 312.

The conductive materials and insulation materials 112 may be separated by word line cuts on doping regions 311 and 312. In some embodiments, conductive materials CM1 to CM8 comprise a metallic conductive material. The conductive materials comprise a non-metallic conductive material such as polysilicon.

A drain 320 may be formed on pillar PL. In some embodiments, drain 320 comprises a semiconductor material (e.g., silicon) having the second conductive type. For example, drain 320 comprises an n-type semiconductor material (e.g., silicon). Below, it is assumed that drain 320 includes n-type silicon. However, the inventive concept is not limited thereto. In some embodiments, drain 320 may be extended toward a top of channel film 114 of pillar PL.

A bit line BL extending in an x-direction may be provided on drain 320. Bit line BL may be connected with drain 320. In some embodiments, drain 320 and bit line BL may be interconnected via a contact plug (not shown). In some embodiments, bit line BL comprises a metallic conductive material. In some embodiments, bit line BL comprises a non-metallic conductive material such as polysilicon.

Figure 4:
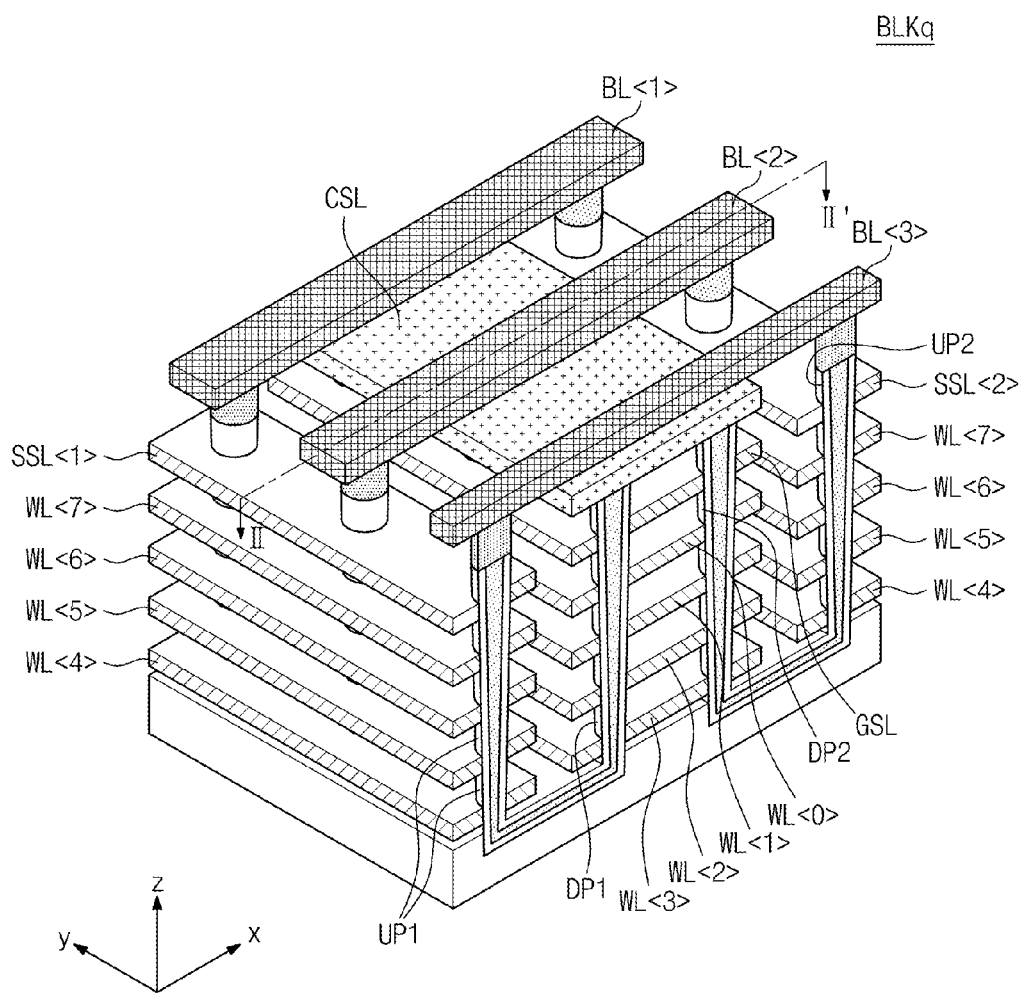
FIG. 4 is a perspective view of a memory block shown in FIG. 1 according to another embodiment of the inventive concept.
Figure 5:
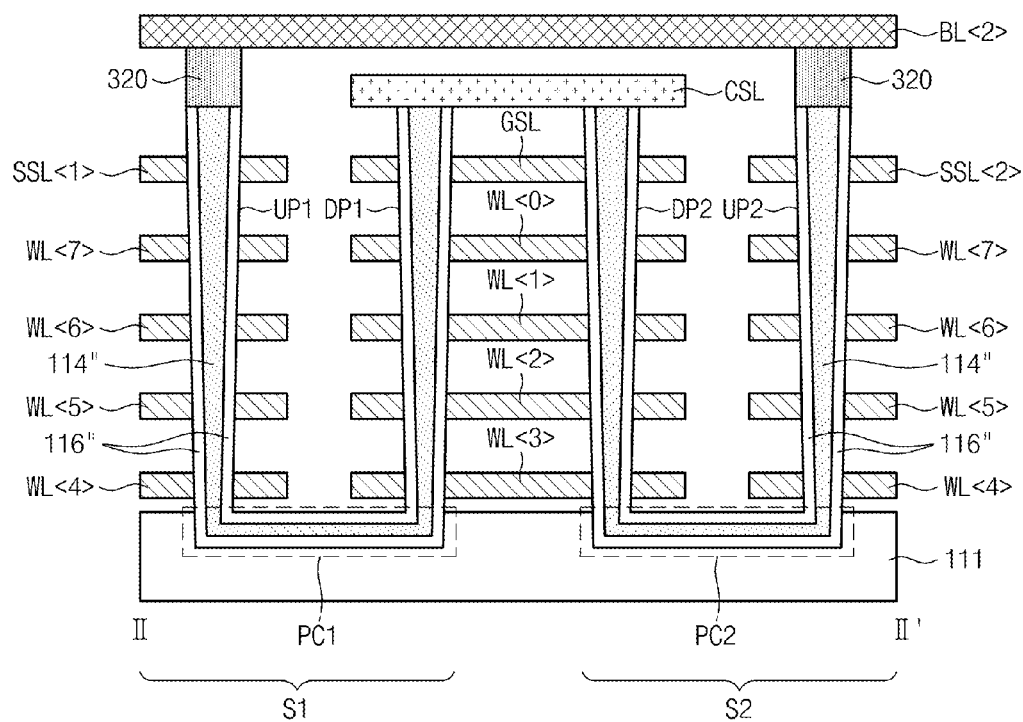
FIG. 5 is a cross-sectional view taken along a line II-II' in FIG. 4.

FIG. 4 is a perspective view of a vertical nonvolatile memory according to another embodiment of the inventive concept. FIG. 5 is a cross-sectional view taken along a line II-IF in FIG. 4.

Referring to FIGS. 4 and 5, word lines WL<4>, WL<5>, WL<6>, and WL<7> extending along a y-direction may be sequentially provided on a substrate 111 along a z-direction. Word lines WL<4>, WL<5>, WL<6>, and WL<7> may be spaced apart along the z-direction. First upper pillars UP1 may be disposed sequentially along the y-direction to penetrate word lines WL<4>, WL<5>, WL<6>, and WL<7>. Herein, word lines WL<4>, WL<5>, WL<6>, and WL<7> may be referred to as upper word lines.

On substrate 101, word lines WL<0>, WL<1>, WL<2>, and WL<3> extending in the y-direction may be provided sequentially along the z-direction. Word lines WL<0>, WL<1>, WL<2>, and WL<3> may be spaced apart in the z-direction. First lower pillars DP1 may be disposed sequentially in the y-direction to penetrate word lines WL<0>, WL<1>, WL<2>, and WL<3> in the z-direction. Second lower pillars DP2 may be disposed sequentially in the y-direction to penetrate word lines WL<0>, WL<1>, WL<2>, and WL<3> in the z-direction. In some embodiments, first lower pillars DP1 and second lower pillars DP2 may be disposed in parallel along the z-direction. Herein, word lines WL<0>, WL<1>, WL<2>, and WL<3> may be referred to as lower word lines.

On substrate 111, word lines WL<4>, WL<5>, WL<6>, and WL<7> extending along the y-direction may be sequentially provided along the z-direction. Word lines WL<4>, WL<5>, WL<6>, and WL<7> may be spaced apart along the z-direction. Second upper pillars UP2 may be disposed sequentially along the y-direction to penetrate word lines WL<4>, WL<5>, WL<6>, and WL<7> along the z-direction.

A common source line CSL extending in the y-direction may be provided on the first and second lower pillars DP1 and DP2. In some embodiments, common source line CSL may be n-type silicon. In some embodiments, in the event that common source line CSL is formed of metal or a non-polar conductive material such as polysilicon, n-type sources may be additionally provided between common source line CSL and the first and second lower pillars DP1 and DP2. In some embodiments, common source line CSL and the first and second lower pillars DP1 and DP2 may be connected via contact plugs, respectively.

Drains 320 may be provided on the first and second upper pillars UP1 and UP2, respectively. In some embodiments, drains 320 may be n-type silicon. On drains 320, bit lines BL<1> to BL<3> extending along the x-direction may be provided sequentially in the y-direction. In some embodiments, bit lines BL<1> to BL<3> may be formed of metal. In some embodiments, bit lines BL<1> to BL<3> and drains 320 are connected via contact plugs.

Each of the first and second upper pillars UP1 and UP2 comprises a surface layer 116" and an inner layer 114". Each of first and second lower pillars DP1 and DP2 comprises a surface layer 116" and an inner layer 114". Surface layers 116" of the first and second upper pillars UP1 and UP2 and first and second lower pillars DP1 and DP2 comprise a blocking insulation film, a charge storage film, and a tunneling insulation film, respectively.

Inner layers 114" of first and second upper pillars UP1 and UP2 and first and second lower pillars DP1 and DP2 comprise p-type silicon, respectively. Inner layers 114″ of first and second upper pillars UP1 and UP2 and first and second lower pillars DP1 and DP2 act as a body.

First upper pillars UP1 are connected with first lower pillars DP1 via first pipeline contacts PC1, respectively. In some embodiments, surface layers 116″ of first upper pillars UP1 are connected with surface layers those of first lower pillars DP1 via first pipeline contacts PC1, respectively. Surface layers of first pipeline contacts PC1 are typically formed of the same material as surface layers 116″ of pillars UP1 and DP1.

In some embodiments, inner layers 114″ of first upper pillars UP1 are connected with those of first lower pillars DP1 via inner layers of first pipeline contacts PC1, respectively. The inner layers of first pipeline contacts PC1 are typically formed of the same material as inner layers 114″ of pillars UP1 and DP1.

First upper pillars UP1 and word lines WL<4>, WL<5>, WL<6>, and WL<7> form first upper strings, and first lower pillars DP1 and word lines WL<0>, WL<1>, WL<2>, and WL<3> may form first lower strings. The first upper strings may be connected with the first lower strings via first pipeline contacts PC1, respectively. Drains 320 and bit lines BL<1> to BL<3> may be connected with one ends of the first upper strings. A common source line CSL may be connected with one ends of the first lower strings. That is, the first upper strings and the first lower strings may form strings connected between bit lines BL<1> to BL<3> and common source line CSL.

Likewise, second upper pillars UP2 and word lines WL<4>, WL<5>, WL<6>, and WL<7> form second upper strings, and second lower pillars DP2 and word lines WL<0>, WL<1>, WL<2>, and WL<3> form second lower strings. The second upper strings are connected with the second lower strings via second pipeline contacts PC2, respectively. Drains 320 and bit lines BL<1> to BL<3> are connected with ends of the second upper strings. Common source line CSL is connected with one ends of the second lower strings. That is, the second upper strings and the second lower strings may form strings connected between bit lines BL<1> to BL<3> and common source line CSL.

In some embodiments, first and second pipeline contact gates (not shown) are provided to form a channel at bodies 114″ of the first and second pipeline contacts PC1 and PC2, respectively. For example, the first and second pipeline contact gates may be provided on surfaces of the first and second pipeline contacts PC1 and PC2, respectively.

As indicated above, word lines WL<0>, WL<1>, WL<2>, and WL<3> may be shared at adjacent lower pillars DP1 and DP2. In addition, where upper pillars adjacent to upper pillars UP1 and UP2 are added, the adjacent upper pillars may be configured to share word lines WL<4>, WL<5>, WL<6>, and WL<7>.

In the vertical nonvolatile memory device described with reference to FIGS. 2 to 5, a memory block comprises multiple cell strings, each of which is selected by at least two string selection lines. However, memory cells formed at the same layer may be exposed to a program voltage although they are connected with an unselected string selection line.

Figure 6:
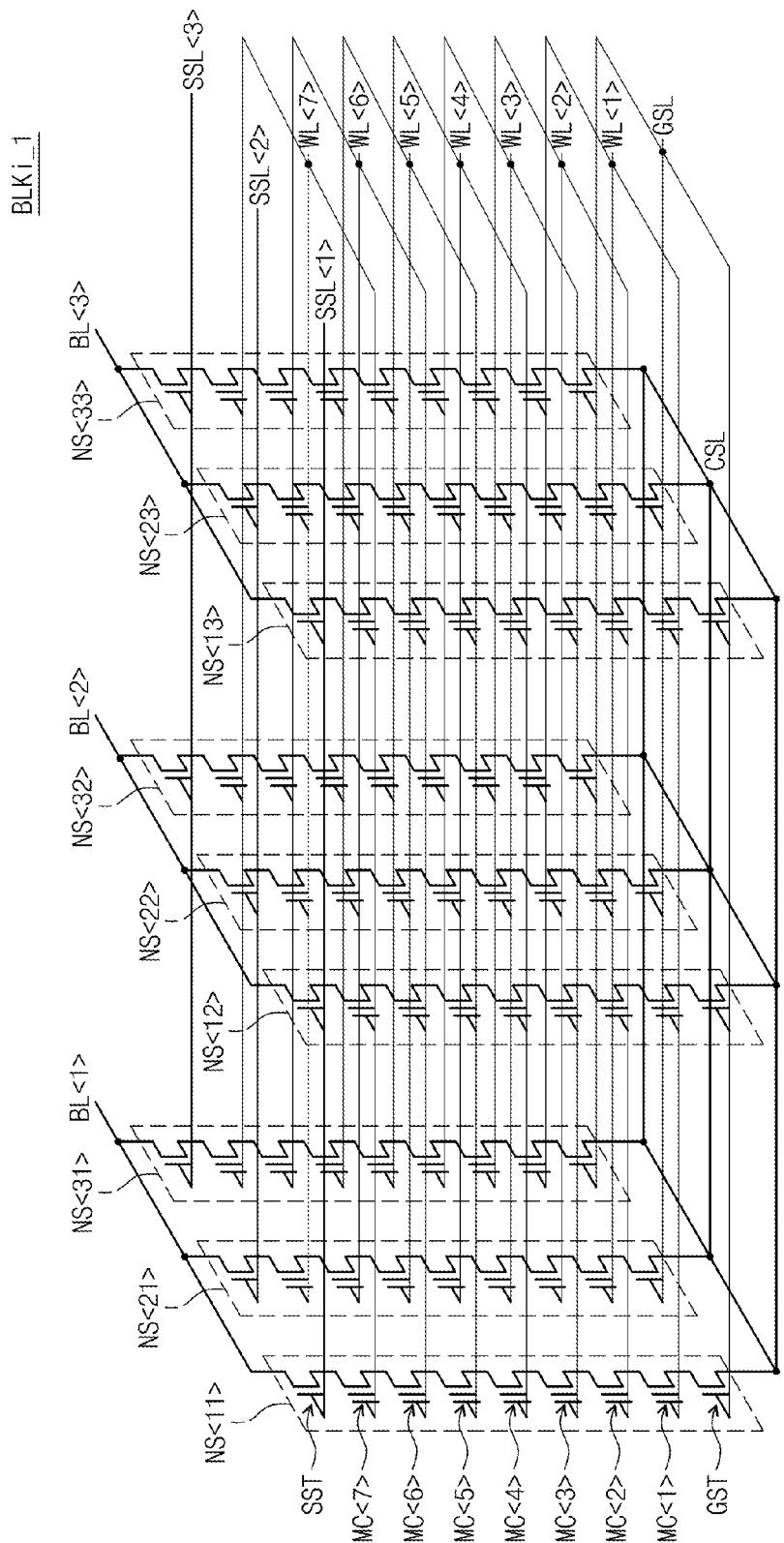
FIG. 6 is a circuit diagram of a memory block shown in FIG. 1 according to an embodiment of the inventive concept.

FIG. 6 is a circuit diagram of a memory block in FIG. 1 according to an embodiment of the inventive concept. For ease of description, it is assumed that three NAND strings are connected to one bit line, and that seven word lines are provided.

Referring to FIG. 6, NAND strings NS<11> to NS<31> are provided between a first bit line BL<1> and a common source line CSL, NAND strings NS<12> to NS<32> are provided between a second bit line BL<2> and common source line CSL, and NAND strings NS<13> to NS<33> are provided between a third bit line BL<3> and common source line CSL.

In each NAND string, a string selection transistor SST is connected to a corresponding bit line, a ground selection transistor GST is connected with common source line CSL, and memory cells are provided between string selection transistor SST and ground selection transistor GST.

In the description that follows, sub blocks may be defined by the row and the column. NAND strings connected in common with a bit line may form a column sub block. For example, NAND strings NS<11> to NS<31> connected with first bit line BL<1> form a first column sub block, NAND strings NS<12> to NS<32> connected with second bit line BL<2> form a second column sub block, and NAND strings NS<13> to NS<33> connected with third bit line BL<3> form a third column sub block.

NAND strings connected with a string selection line form a row sub block. For example, NAND strings NS<11> to NS<31> connected with a first string selection line SSL<1> form a first row sub block, NAND strings NS<21> to NS<23> connected with second string selection line SSL<2> form a second row sub block, and NAND strings NS<31> to NS<33> connected with third string selection line SSL<3> form a third row sub block.

Respective heights of each NAND string may be defined as follows. A height of ground selection transistor GST may be defined as 1. A memory cell MC<1> adjacent to ground selection transistor GST may be defined as 2. A height of sting selection transistor SST may be defined as 9. A memory cell MC<7> adjacent to string selection transistor SST may be defined as 8. The farther a distance between a memory cell and ground selection transistor GST, the higher a height of a memory cell MC. That is, the first to seventh memory cells MC<1> to MC<7> may have second to eighth heights, respectively.

Each NAND string shares a ground selection line GSL, which may have a first height. Memory cells, having the same height among memory cells of NAND strings in the same row sub block share a word line. Word lines corresponding to different row sub blocks and having the same height are interconnected. That is, memory cells at the same height share a word line.

NAND strings in the same row sub block share the same string selection line SSL. For example, NAND strings NS<11> to NS<13> in the first row sub block may share first string selection line SSL<1>. NAND strings in different row sub blocks are connected to different string selection lines. For example, NAND strings NS<11> to NS<13> in the first row sub block may be connected with first string selection line SSL<1>, NAND strings NS<21> to NS<23> in the second row sub block may be connected with second string selection line SSL<2>, and NAND strings NS<31> to NS<33> in the third row sub block may be connected with third string selection line SSL<3>.

First string selection transistors SST1 may be defined as string selection transistors SST connected with first string selection line SSL<1>. Second string selection transistors SST2 may be defined as string selection transistors SST connected with second string selection line SSL<2>. Third string selection transistors SST3 may be defined as string selection transistors SST connected with third string selection line SSL<3>. Common source line CSL may be connected in common with NAND strings.

As illustrated in FIG. 6, word lines at the same height are connected in common, so where a word line at a specific height is selected, all NAND strings connected with the selected word line are selected. NAND strings in different row sub blocks are connected with different string selection lines. Thus, NAND strings belonging to an unselected row sub block among NAND strings connected with the same word line are separated from a corresponding bit line. Alternatively, NAND strings belonging to a selected row sub block among NAND strings connected with the same word line are connected with a corresponding bit line.

In program and reads operation, one of string selection lines SSL<1> to SSL<3> is selected. As a result, a row sub block corresponding to a selected string selection line is selected. Also in program and read operations, a selection voltage is applied to a selected word line, and a non-selection voltage is applied to unselected word lines. For example, the selection voltage may be a program voltage Vpgm or a selection read voltage Vrd, and the non-selection voltage may be a pass voltage Vpass or a non-selection read voltage Vread.

Program and read operations are performed by the page by selecting a row sub block and a word line. The page may be formed of memory cells connected with the same word line among memory cells in the same row sub block.

Where a memory cell stores 1-bit data, for example, memory cells connected with the same word line among memory cells in the same row sub block correspond to a page. In other examples, where a memory cell stores 2-bit data, memory cells connected with the same word line among memory cells in the same row sub block correspond to two pages. That is, where a memory cell stores 2-bit data, memory cells physically connected with one word line may be logically divided into two pages.

In a nonvolatile memory device having a vertical structure described with reference to FIGS. 2 to 6, one memory block comprises multiple cell strings. Each cell string is selected by a corresponding string selection line. Memory cells at the same layer may share the same word line. Thus, although memory cells in the same layer are connected with an unselected string selection line, they may be supplied with a program voltage.

Where memory cells connected with a selected string selection line (i.e., a selected page) among memory cells at the same layer are programmed, a threshold voltage distribution of memory cells (i.e., an unselected page), connected with an unselected string selection line, from among memory cells at the same layer may widen due to the program disturbance. This may mean that a read margin is reduced.

Where multiple pages in the same layer are programmed in a given sequence, different pages may suffer from different program disturbance according to the programming orders of the pages. Reduction of a read margin due to the program disturbance when a program operation is performed according to a given program order will be described with reference to FIGS. 7 to 11. Program and read operations will be described with reference to FIGS. 12 to 19. Using these program and read operations, it is possible to prevent reduction of a read margin and a read fail.

In the description of FIG. 6, an example is presented where first to seventh word lines WL<1> to WL<7> are provided and memory cells connected with first to seventh word lines WL<1> to WL<7> store data. The inventive concept is not limited to this example, however. At least one of the first to seventh word lines WL<1> to WL<7> can be used as a dummy word line, and memory cells connected with the dummy word line can be used as dummy memory cells.

For example, first word line WL<1> and/or seventh word line WL<7> of first to seventh word lines WL<1> to WL<7> can be used as a dummy word line, and memory cells connected with first word line WL<1> and/or seventh word line WL<7> can be used as dummy memory cells. In other embodiments, fourth word line WL<4> of first to seventh word lines WL<1> to WL<7> can be used as a dummy word line, and memory cells connected with fourth word line WL<4> and/or seventh word line WL<7> can be used as dummy memory cells.

Figure 7:
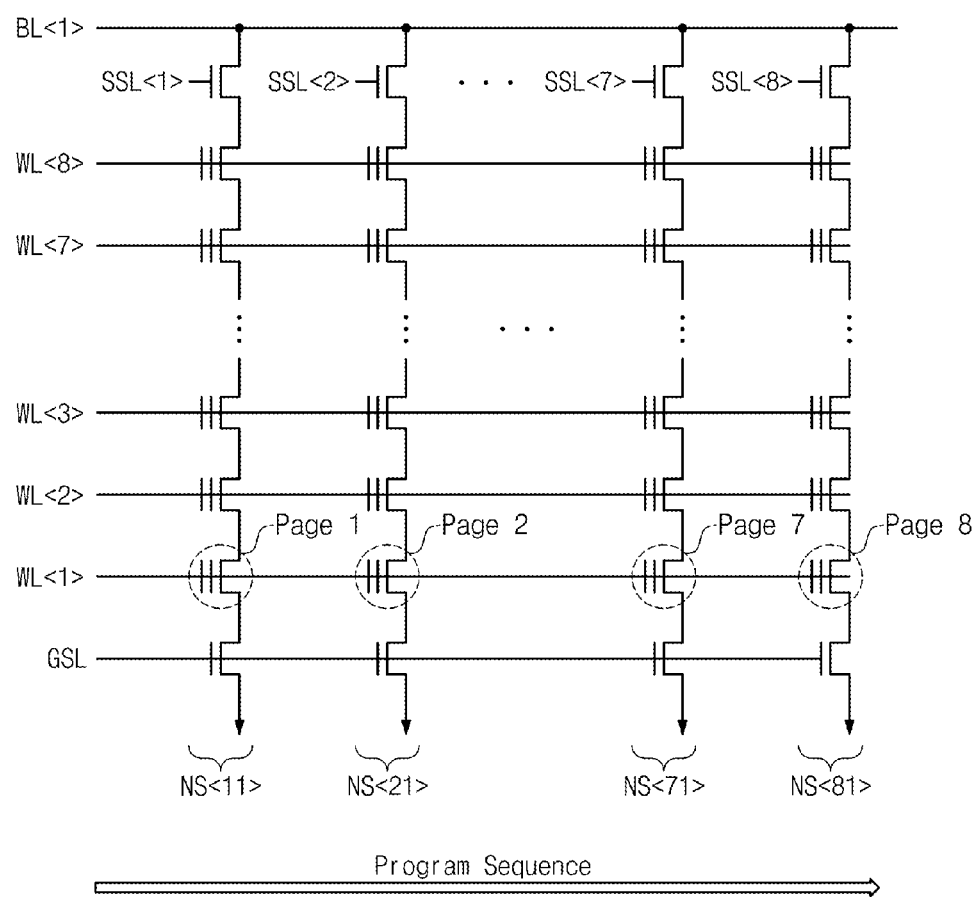
FIG. 7 is a circuit diagram of NAND strings connected with a bit line in the memory block of FIG. 6.

FIG. 7 is a circuit diagram of NAND strings connected with a bit line in the memory block shown in FIG. 6. In particular, FIG. 7 illustrates NAND strings connected with a first bit line BL<1>. For ease of description, it is assumed that eight NAND strings are connected with first bit line BL<1>. It is also assumed that a program operation progresses from a first NAND string NS<11> to an eight NAND string NS<81>.

Referring to FIG. 7, first to eighth NAND strings NS<11> to NS<81> are connected with first bit line BL<1> via first to eighth string selection lines SSL<1> to SSL<8>. Each NAND string is selected by activating a corresponding string selection line. For example, where first bit line BL<1> and first string selection line SSL<1> are activated, first NAND string NS<11> is selected, and where first bit line BL<1> and second string selection line SSL<2> are activated, second NAND string NS<21> is selected.

Pages can be programmed in an order from first NAND string NS<11> to eighth NAND string NS<81>. A page is formed of memory cells which share the same word line and are selected by the same string selection line. For example, a first page is formed of memory cells that share first word line WL<1> and are selected by first string selection line SSL<1>. A second page is formed of memory cells that share second word line WL<2> and are selected by second string selection line SSL<2>.

Where one memory cell stores 1-bit data, memory cells selected by one string selection line and one word line constitute a page. Where one memory cell stores 2-bit data, memory cells selected by one string selection line and one word line constitute two pages. That is, memory cells physically connected with one word line form two pages logically. In this case, one of two pages may be a page where LSB data is stored, and the other may be a page where MSB data is stored.

First to eighth pages are selected by first to eighth string selection lines SSL<1> to SSL<8>, respectively. The first to eighth pages share first word line WL<1>. Thus, if one page among the first to eighth pages is programmed, a program voltage may be provided to unselected word lines via the same word line. This can reduce a read margin of each page in FIG. 7.

Figure 8:
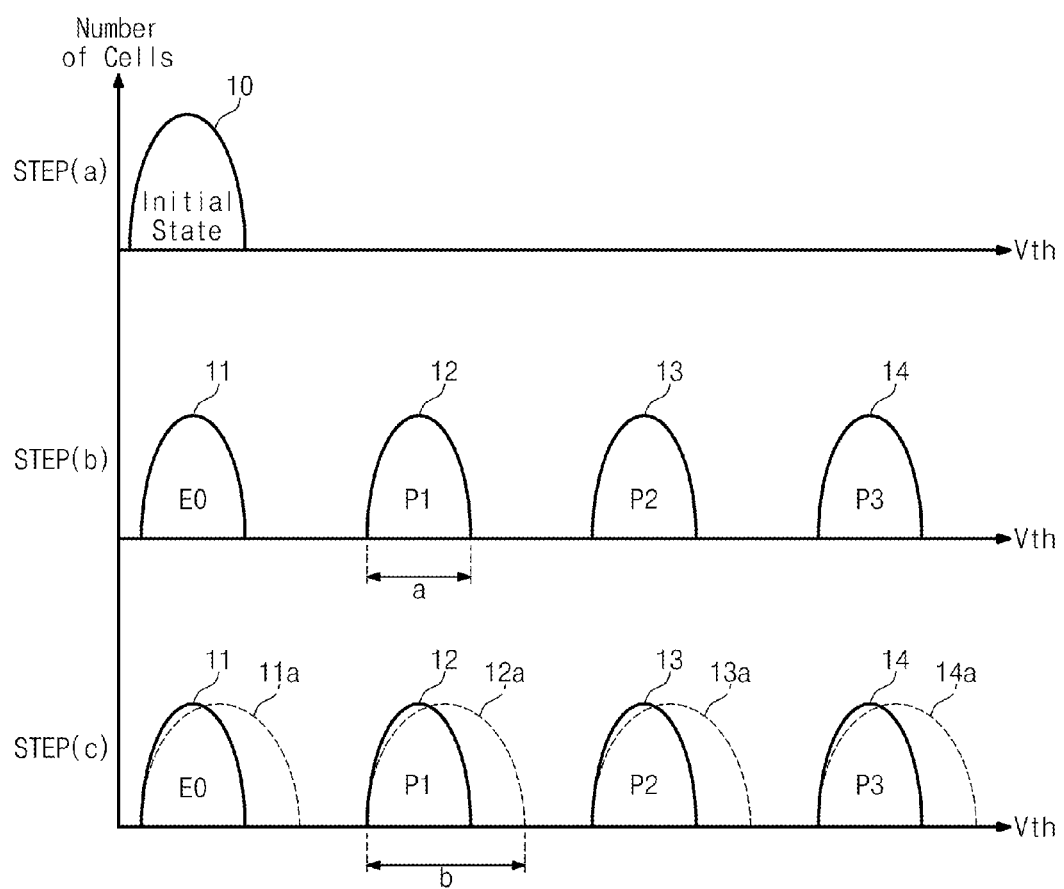
FIG. 8 is a threshold voltage diagram illustrating a reduction of read margins in a first page among first to eighth pages.

FIG. 8 is a threshold voltage diagram illustrating a reduction of read margins in a first page among first to eighth pages. The first page is first programmed, and it is subsequently affected by program operations of the second to eighth pages. Below, a variation in a threshold voltage distribution of the first page due to the program disturbance will be more fully described with reference to FIGS. 7 and 8.

Referring to FIG. 8, in step (a) prior to a program operation, a first page has a threshold voltage distribution corresponding to an initial state 10.

In a step (b), the first page is programmed. That is, the first page may be programmed to have an erase state 11, a first program state 12, a second program state 13, and a third program state 14.

Erase state 11 may be substantially the same as initial state 10. That is, memory cells, corresponding to erase state 11 among memory cells of the first page may be program inhibited. Alternatively, memory cells corresponding to erase state 11 may be programmed to have a threshold voltage higher than that of initial state 10.

In step (c), the second to eighth pages are programmed. In this case, the first page is affected through first word line WL1, so it suffers from a program disturbance. Afterwards, the disturbance generated at programming of another page after one page is programmed may be referred to as the disturbance after program ("DAP").

Threshold voltage distributions of states corresponding to the first page widen due to the DAP associated with the second to eighth pages. For example, as illustrated in step (c), a threshold voltage distribution of erase state 11 may widen as illustrated by a dotted line 11a. Similarly, a threshold voltage distribution of erase state 12 may widen as illustrated by a dotted line 12a.

A read margin of the first page which is first programmed may be reduced by the DAP. For example, because a width of a threshold voltage distribution of first program state P1 widens from "a" to "b", a read margin between first program state P1 and second program state P2 may be reduced.

Where a read margin between first program state P1 and second program state P2 is not secured sufficiently compared with a read margin between erase state E0 and first program state P1, a read fail may be generated in a read operation of the first page. This may be due to a reduction in read margins among program states P1, P2, and P3.

Figure 9:
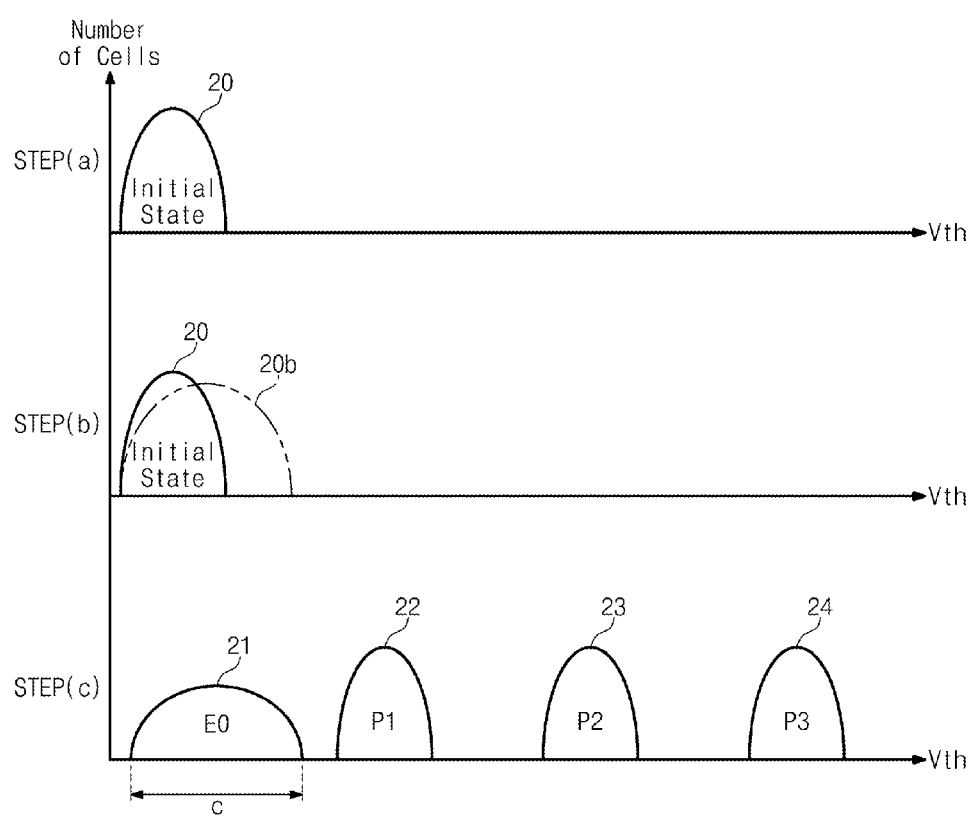
FIG. 9 is a threshold voltage diagram illustrating a reduction of read margins in an eighth page among first to eighth pages.

FIG. 9 is a threshold voltage diagram illustrating a reduction of read margins in an eighth page among first to eighth pages. The eighth page is programmed last, so before it is programmed, the eighth page may be affected by program operations of the first to seventh pages. Below, a variation in a threshold voltage distribution of the eighth page due to the program disturbance will be more fully described with reference to FIGS. 7 and 9.

Referring to FIG. 9, in step (a) before the program operation, a first page has a threshold voltage distribution corresponding to an initial state 20. Next, in step (b), the first to seventh pages are programmed before the eighth page is programmed. In this case, the eighth page suffers from the program disturbance via a first word line WL<1>. A disturbance generated by a program operation of another page before a page is programmed may be referred to as a disturbance before program ("DBP"). A threshold voltage distribution of an initial state of the eighth page may widen from 20 to 20b.

In step (c), the eighth page is programmed to have an erase state 21, a first program state 22, a second program state 23, and a third program state 24. Erase state 21 is substantially equal to initial state 20b. That is, memory cells, corresponding to erase state 21, from among memory cells of the eighth may be program inhibited. Alternatively, where the eighth page is programmed, memory cells corresponding to erase state 21 can be programmed to have a threshold voltage higher than that corresponding to initial state 20b.

Because the eighth page is programmed last, it may not suffer from the DAP. Thus, as illustrated at step (c), sufficient read margins may exist among the first to third program states 22 to 24. However, the initial state of the eighth has a wide threshold voltage window due to the DBP, initial state E0 of the eighth page may have a wide threshold voltage window corresponding to "c". That is, a read margin between initial state 21 and first program state 22 of the eighth page may be reduced. This may mean that a read fail is generated due to reduction of a read margin between erase state E0 and first program state P1 in a read operation of the first page.

Figure 10:
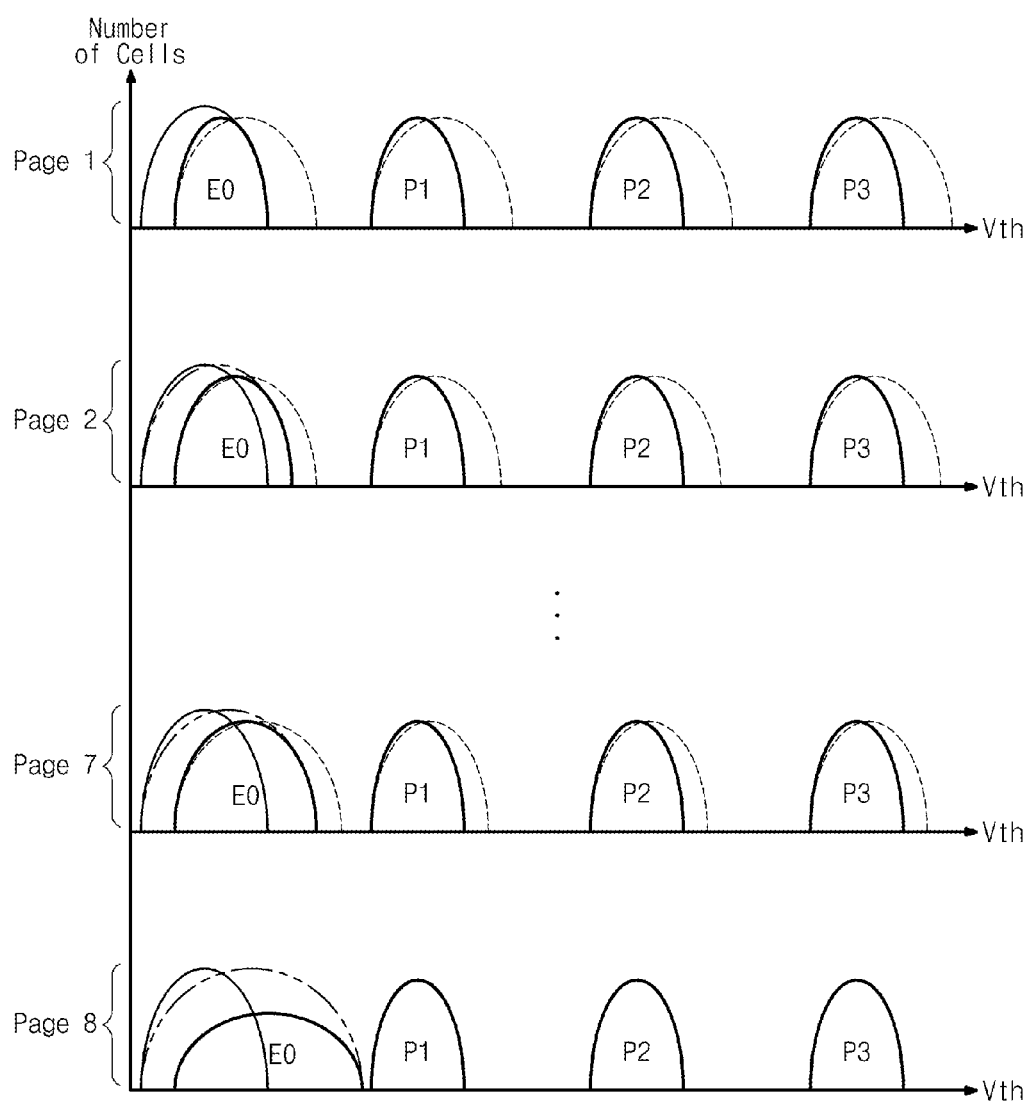
FIG. 10 is a threshold voltage diagram for sequential programming of first to eighth pages.

FIG. 10 is a threshold voltage diagram for sequential programming of first to eighth pages. In the description that follows, a variation in a threshold voltage distribution according to a program order will be described with reference to FIGS. 7 to 10.

Referring to FIG. 10, first and second pages are programmed to be faster than other pages. Thus, as illustrated in FIG. 8, the first and second pages may be much more affected by DAP compared to the seventh and eighth pages. For example, as second to eighth pages are programmed, the first page may be affected by the DAP seven times. The second page may be affected by DBP once when the first page is programmed and by the DAP six times. In this case, as illustrated in FIG. 10, threshold voltage distributions of the first and second pages may increase. In particular, where a sufficient read margin is secured between an erase state E0 and a first program state P1, as illustrated in FIG. 10, a read fail may be generated due to reduction of a read margin among first to third program states P1 to P3.

The seventh and eighth pages may be programmed later than other pages. Thus, as illustrated in FIG. 9, the seventh and eighth pages may be much more affected by the DBP compared with the first and second pages. For example, the seventh page may be affected by the DBP six times when the first to sixth pages are programmed and by the DAP once when the eighth page is programmed. Also, the eighth page may be affected by the DBP seven times when the first to seventh pages are programmed. In this case, as illustrated in FIG. 10, a read fail may be generated due to reduction of a read margin between an erase state E0 and first program state P1.

As described with reference to FIGS. 8 to 10, a page programmed in advance among pages sharing the same word line may be much more affected by the DAP compared with other pages. In this case, a read fail due to reduction of a read margin between program states may be a problem. On the other hand, a page, programmed later among pages sharing the same word line may be much more affected by the DBP compared with other pages. In this case, a read fail due to reduction of a read margin between an erase state and a program state may be a problem.

To address the above problems, nonvolatile memory device 100 may use different program and read schemes according to a program sequence. This can prevent a read fail due to DBP, as described in further detail with reference to FIGS. 11 to 19.

Although FIG. 10 shows an example where an erase state has a threshold voltage higher than that of an initial state (or, an initial state affected by the disturbance), the inventive concept is not limited to this example. For instance, as illustrated in FIGS. 8 and 9, an erase state can be substantially identical to an initial state (or, an initial state affected by the disturbance).

Figure 11:
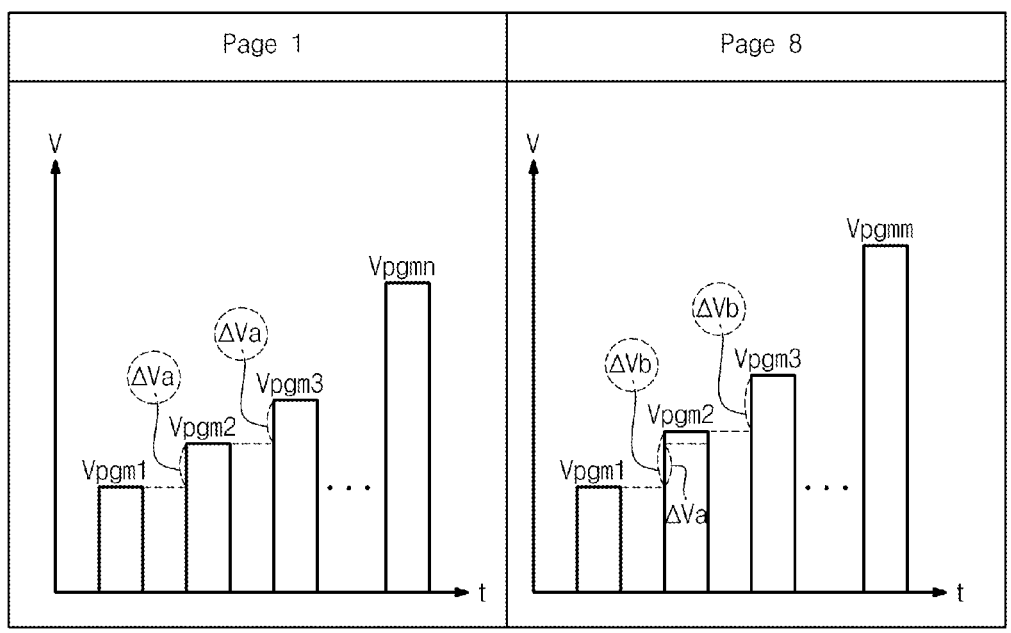
FIG. 11 is a voltage diagram illustrating a program operation according to an embodiment of the inventive concept.

FIG. 11 is a voltage diagram illustrating a program operation according to an embodiment of the inventive concept. This program operation can prevent a read fail of a page programmed faster than other pages. For ease of description, the program operation will be described through comparison between a first page and an eighth page.

Referring to FIG. 11, the program operation may be performed using incremental step pulse programming (ISPP). Where a first page is programmed, program voltages Vpgm1 to Vpgmn that are stepwise increased by $\Delta Va$ at iterations of program loops are provided to a first word line WL<1>. On the other hand, where the eighth page is programmed, program voltages Vpgm1 to Vpgmn that are stepwise increased by $\Delta Vb$ at iterations of program loops are provided to first word line WL<1>. Herein, $\Delta Vb$ is larger than $\Delta Va$.

As the increment of a threshold voltage of the first page is set to be smaller than that of the eighth page, a threshold voltage window of the first page may be narrower than that of the eighth page. In this case, although the first page is affected by DAP, a read margin is sufficiently secured.

Figure 12:
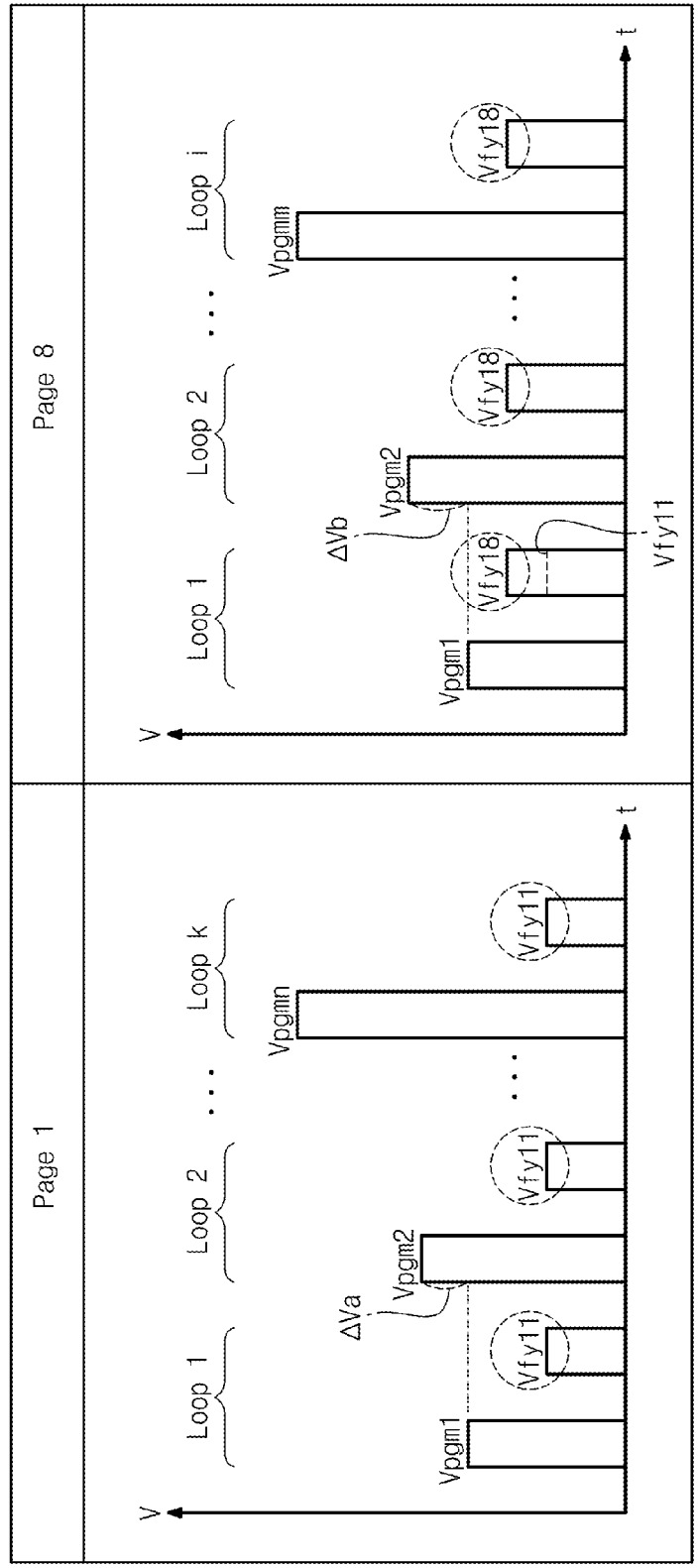
FIG. 12 is a voltage diagram illustrating a program operation according to an embodiment of the inventive concept.

FIG. 12 is a voltage diagram illustrating a program operation according to an embodiment of the inventive concept. The program operation can prevent a read fail of a page programmed slower than other pages. For ease of description, it is assumed that an increment of a threshold voltage corresponding to a first page is smaller than that corresponding to an eighth page. The program operation will be described through comparison between the first and eighth pages.

Referring to FIG. 12, the program operation is performed using ISPP. It is assumed that a program operation on the first page is formed of "k" program loops and a program operation on the eighth page is formed of "i" program loops. Also, it is assumed that one program voltage and one verification read voltage are used in each program loop. However, the inventive concept is not limited to these assumptions. For example, program operations of the first and eighth pages may be executed using the same program loop number, and multiple program voltages and verification read voltages may be used at each program loop.

Where the first page is programmed, a first verification read voltage Vfy11 is provided to the first page. Where the eighth page is programmed, a first verification read voltage Vfy18 higher than first verification read voltage Vfy11 for the first page is provided to the eighth page.

Herein, first verification read voltage Vfy11 for the first page is a verification read voltage on a first program state P1 of the first page, and first verification read voltage Vfy18 for the eighth page is a verification read voltage on a first program state P1 of the eighth page.

As first verification read voltage Vfy18 for the eighth page is set to be higher than first verification read voltage Vfy11 for the first page, a read margin between an erase state E0 and a first program state P1 of the eighth page may be larger than that of the first page. In this case, although the eighth page is affected by DBP, a read margin may be sufficiently secured.

Figure 13:
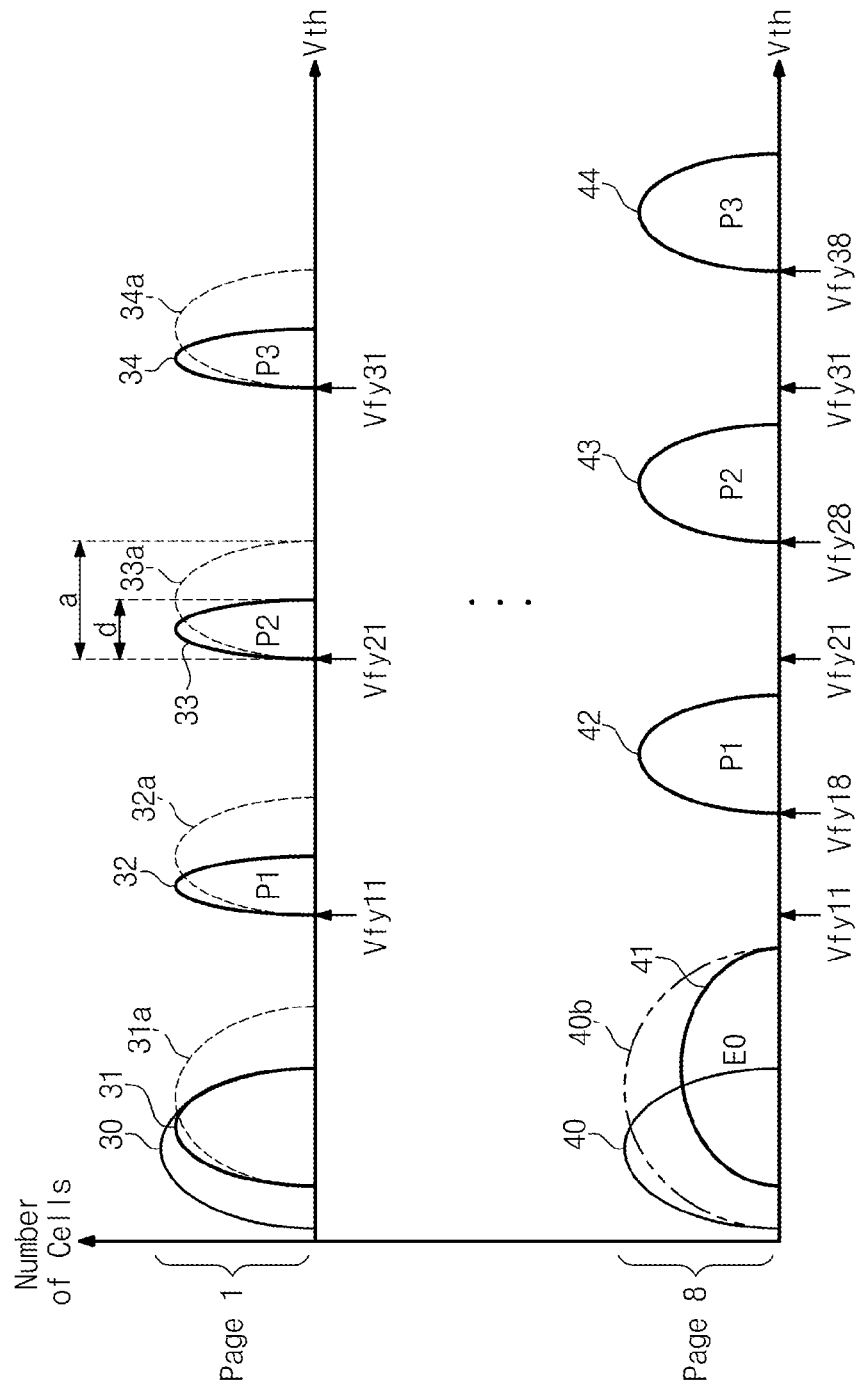
FIG. 13 is a threshold voltage diagram for first and eighth pages programmed by the program operations of FIGS. 11 and 12.

FIG. 13 is a threshold voltage diagram of first and eighth pages programmed according to program methods in FIGS. 11 and 12. In FIG. 13, reference numerals 30 and 40 indicate threshold voltage distributions of initial states of first and eighth pages. Reference numerals 31 to 34 indicate threshold voltage distributions where the first page is programmed, and reference numerals 41 to 44 indicate threshold voltage distributions where the eighth page is programmed Reference numerals 31a to 34a indicate that threshold voltages of the first page are increased due to DAP. A reference numeral 40b indicates that a threshold voltage of the eighth page is increased by DBP.

As described with reference to FIG. 11, an increment of a threshold voltage in a program operation of the first page may be smaller than an increment of a threshold voltage in a program operation of the eighth page. Thus, as illustrated in FIG. 13, if the first page is programmed, a threshold voltage window of the first page may be narrower than that of the eighth page. In this case, although a threshold voltage window of the first page widens from "d" to "a" due to the DAP generated at program operations of the second to eighth pages, a sufficient read margin may be secured among program states P1 to P3 of the first page. Thus, it is possible to prevent a read fail due to the DAP.

Also, as described with reference to FIG. 12, a verification read voltage Vfy18 for the eighth page may be higher than a verification read voltage Vfy11 of the first page. Thus, as illustrated in FIG. 13, a first program state P1 of the eighth page may be formed to have a higher threshold voltage compared with of a first program state P1 of the first page.

In this case, although a threshold voltage window of an erase state E0 widens due to the DBP generated at program operations of the first to seventh pages, a read margin between erase state E0 and first program state P1 may be sufficiently secured. Thus, it is possible to prevent a read fail due to the DBP.

Meanwhile, as illustrated in FIG. 13, as a second verification read voltage Vfy28 for the eighth page is set to be higher than a second verification read voltage Vfy21 of the first page and a third verification read voltage Vfy38 for the eighth page is set to be higher than a third verification read voltage Vfy31 of the first page, read margins among program states 42, 43, and 44 may be sufficiently secured.

As described with reference to FIGS. 11 to 13, nonvolatile memory device 100 may prevent a read fail due to reduction of a read margin by using different program schemes according to a program sequence of multiple pages sharing the same word line. However, the inventive concept is not limited to the described schemes.

Figure 14:
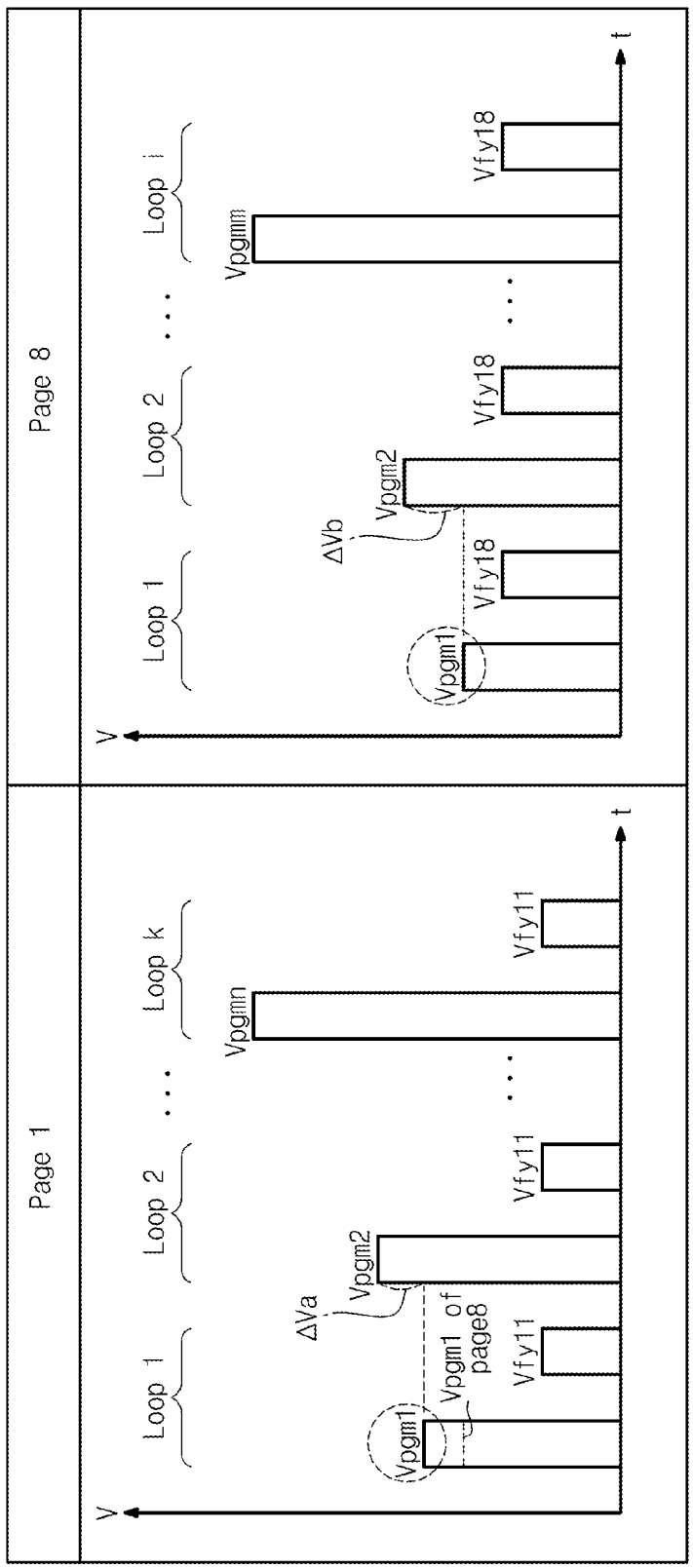
FIG. 14 is a voltage diagram for a program operation according to another embodiment of the inventive concept.

FIG. 14 is a voltage diagram for a program operation according to another embodiment of the inventive concept. For explanation purposes, it is assumed that an increment of a threshold voltage corresponding to a first page is smaller than that corresponding to an eighth page. Also, it is assumed that a verification read voltage of the eighth page is higher than a verification read voltage of the first page.

Referring to FIG. 14, a first program voltage Vpgm1 provided in a program operation of the first page is higher than a first program voltage Vpgm1 provided in a program operation of the eighth page. This may prevent an execution time of a program operation from being longer due to an increment of a threshold voltage set to be lower than that of the eighth page.

Because an increment of a threshold voltage of the first page is set to be lower than an increment of a threshold voltage of the eighth page, the time taken to program the first page may be longer than a time taken to program the eighth page. To prevent this phenomenon, a start program voltage Vpgm1 of the first page may be set to be higher than a start program voltage Vpgm1 of the eighth page. A time take to program the first page may be prevented from being longer due to a relatively low increment of a threshold voltage by setting a threshold voltage increased by a first loop to be high.

Figure 15:
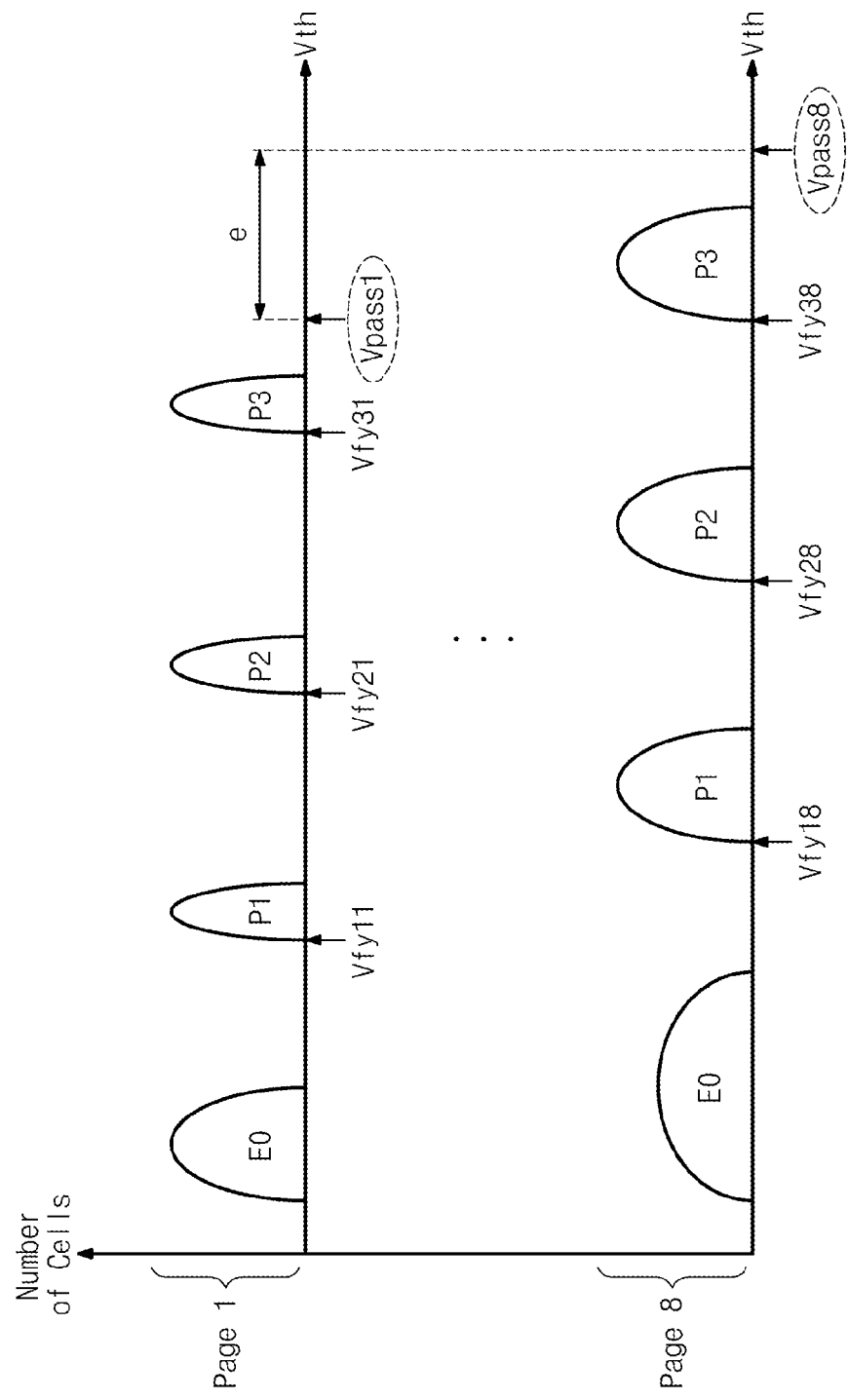
FIG. 15 is a threshold voltage diagram for a program operation according to another embodiment of the inventive concept.

FIG. 15 is a threshold voltage diagram for a program operation according to another embodiment of the inventive concept. This program operation will be described through comparison between a threshold voltage distribution of a first page and a threshold voltage distribution of an eighth page.

As described with reference to FIG. 13, a threshold voltage window of the first page may be narrower than that of the eighth page. Also, a threshold voltage of each program state of the eighth page may be higher than that of the first page.

In this case, as illustrated in FIG. 15, where the first page is programmed, a first pass voltage Vpass1 may be provided to remaining word lines WL<2> to WL<8> other than first word line WL<1>. On the other hand, where the eighth page is programmed, an eighth pass voltage Vpass8 higher by "e" than first pass voltage Vpass1 is provided to remaining word lines WL<2> to WL<8> other than first word line WL<1>. That is, a pass voltage to be provided to a page, programmed in advance, from among multiple pages sharing the same word line may be lower than a pass voltage to be provided to a page, programmed later, from among the pages sharing the same word line.

Figure 16:
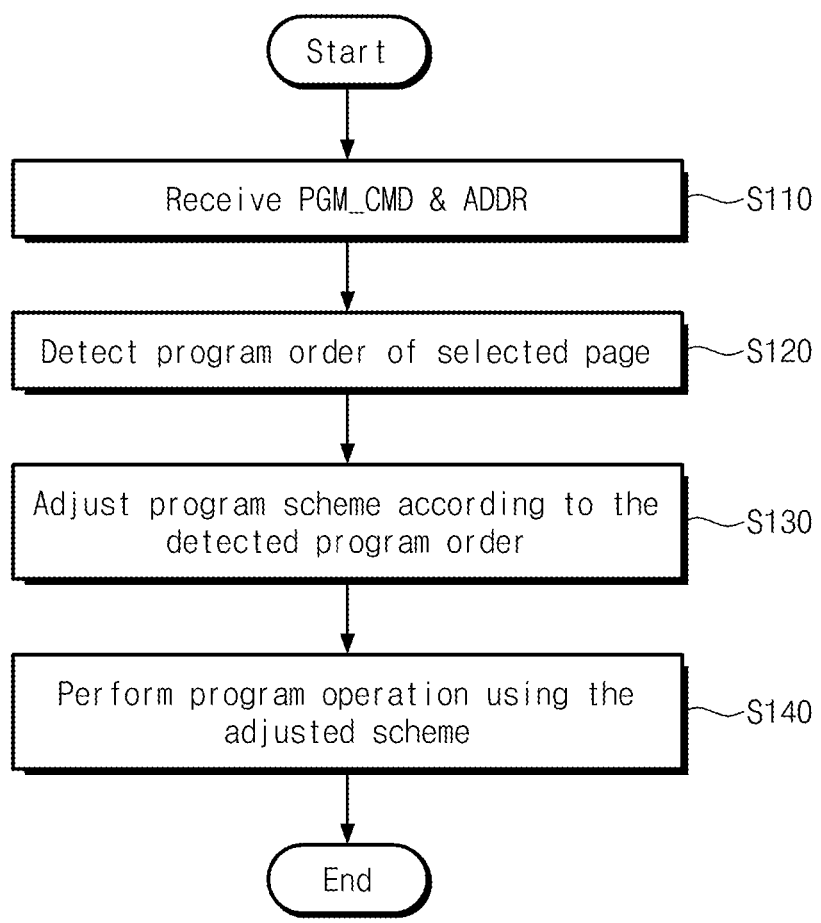
FIG. 16 is a flowchart illustrating a program operation according to an embodiment of the inventive concept.

FIG. 16 is a flowchart illustrating a program operation according to an embodiment of the inventive concept. For convenience, the program operation will be described with in the context of nonvolatile memory device 100 as described above. However, the program operation can be performed in alternative contexts.

Referring to FIG. 16, in operation S110, control logic 150 receives a program command PGM_CMD and an address ADDR from an external device.

Next, in operation S120, control logic 150 selects a string selection line SSL of a page, corresponding to the input address, from among multiple pages sharing the same word line. Thereafter, in operation S130, control logic 150 adjusts a program scheme according to a location of the selected string selection line. For example, as illustrated in FIG. 7, where a program scheme is determined according to a location of a string selection line, control logic 150 may determine a program sequence of a corresponding page according to a location of the selected string selection line.

Control logic 150 may adjust a program scheme such that program voltages having different threshold voltage increments are generated according to a location of the selected string selection line. Alternatively, control logic 150 may adjust a program scheme to have different verification read voltages according to a program sequence.

In operation S140, a program operation is executed according to the adjusted program scheme. For example, where the selected page is programmed prior to other pages sharing the same word line, control logic 150 controls a voltage generator 120 to generate program voltages having a low threshold voltage increment. Afterwards, a program operation may be performed using the adjusted program voltage.

In other example embodiments, where the selected page is programmed after other pages sharing the same word line, control logic 150 may control voltage generator 120 to generate a high verification read voltage. Afterwards, a program operation is performed using the adjusted verification read voltage.

Figure 17:
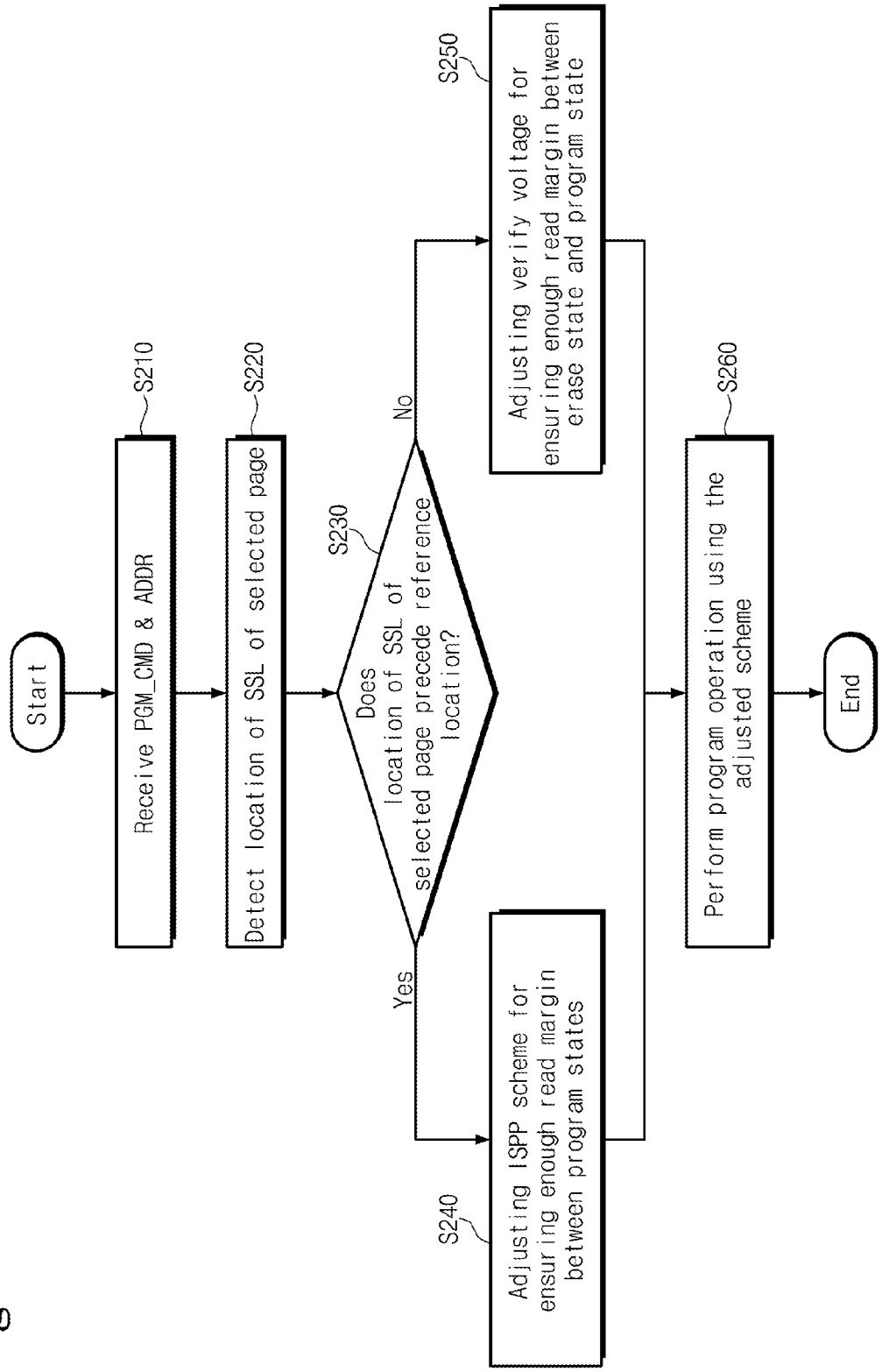
FIG. 17 is a flowchart illustrating a program operation according to another embodiment of the inventive concept.

FIG. 17 is a flowchart illustrating a program operation according to another embodiment of the inventive concept. For convenience, the program operation will be described in the context of nonvolatile memory device 100 as described above. However, the program operation can be performed in alternative contexts.

Referring to FIG. 17, in operation S210, control logic 150 receives a program command PGM_CMD and an address ADDR from an external device. Next, in operation S220, control logic 150 detects a location of a string selection line SSL of a page, corresponding to the input address, from among multiple pages sharing the same word line. That is, as illustrated in FIG. 7, where a program order is determined according to a location of a string selection line, control logic 150 determines a program order of a corresponding page according to a location of the selected string selection line.

Subsequently, in operation S230, control logic 150 determines whether a location of a string selection line of the selected page precedes a location of a reference string selection line. That is, as illustrated in FIG. 7, where a program order is determined according to a location of a string selection line, whether the selected page is programmed prior to a page of a reference string selection line may be determined by comparing a location of a string selection line of the selected page with a location of the reference string selection line.

Herein, a location of the reference string selection line may mean an order being a criterion used to determine which of DBP and DAP affects the selected page much more. For example, in the event that first to eighth pages are programmed sequentially, a location of the reference string selection line may be a location of a string selection line corresponding to a fourth page or a fifth page. In this case, the fourth or fifth page may be referred to as a reference page.

Where a location of a string selection line of the selected page precedes a location of the reference string selection line (i.e., in case that the selected page is programmed prior to the reference page), in operation S240, an increment of a threshold voltage of ISPP is set to be smaller than that in case that a location of a string selection line of the selected page follows a location of the reference string selection line. This may form a threshold voltage window of the selected page narrowly by setting a threshold voltage increment low.

Where a location of a string selection line of the selected page follows a location of the reference string selection line (i.e., in case that the selected page is programmed after the reference page), in operation S250, a verification read voltage may be set to be higher than that in case that a location of a string selection line of the selected page precedes a location of the reference string selection line. This may be to secure a read margin between an erase state and a program state adjacent to the erase state by setting a verification read voltage high.

Subsequently, in operation S260, a program operation is performed using the adjusted scheme. Operation S260 may be similar to operation S140 in FIG. 16, so a description thereof is omitted.

As described with reference to FIGS. 11 to 17, nonvolatile memory device 100 uses different program schemes according to a program order of a selected page. This can prevent a read fail due to reduction of a read margin. Additionally, because nonvolatile memory device 100 uses different program schemes according to a program order of a selected page, a read operation may be performed using different read schemes according to a programmed order of the selected page, as will be described in further detail below.

Figure 18:
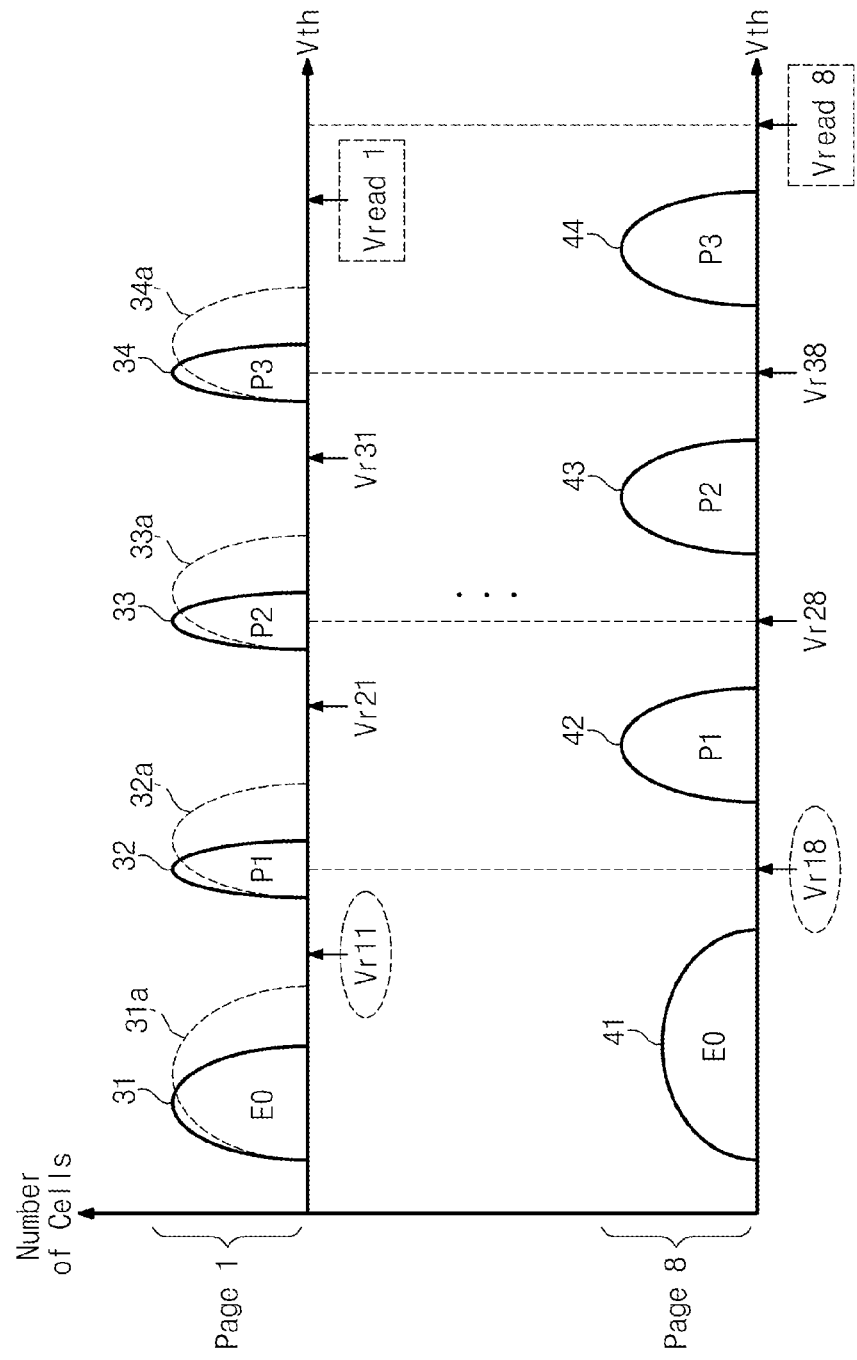
FIG. 18 is a threshold voltage diagram illustrating a read operation according to an embodiment of the inventive concept.

FIG. 18 is a diagram illustrating a read operation according to an embodiment of the inventive concept. In the description of FIG. 18, it is assumed that a threshold voltage distribution in FIG. 18 is equal to that in FIG. 13. A read operation on a first page may be compared with a read operation of an eighth page.

Referring to FIG. 18, where a first page is read, first to third read voltages Vr11 to Vr31 are provided to a selected first word line WL<1>, and a first non-selection read voltage Vread1 is provided to unselected word lines.

On the other hand, where the eighth page is read, first to third read voltages Vr18 to Vr38 higher than first to third read voltages Vr11 to Vr31 are provided to selected first word line WL<1>, and an eighth non-selection read voltage Vread8 higher than the first non-selection read voltage Vread1 is provided to unselected word lines. That is, a selection read voltage may be lower when provided to a selected word line when a page programmed in advance is read than when provided to a selected word line when a page programmed later. Similarly, a non-selection read voltage may be lower when provided to an unselected word line when a page programmed in advance is read than when provided to an unselected word line when a page programmed later is read.

Figure 19:
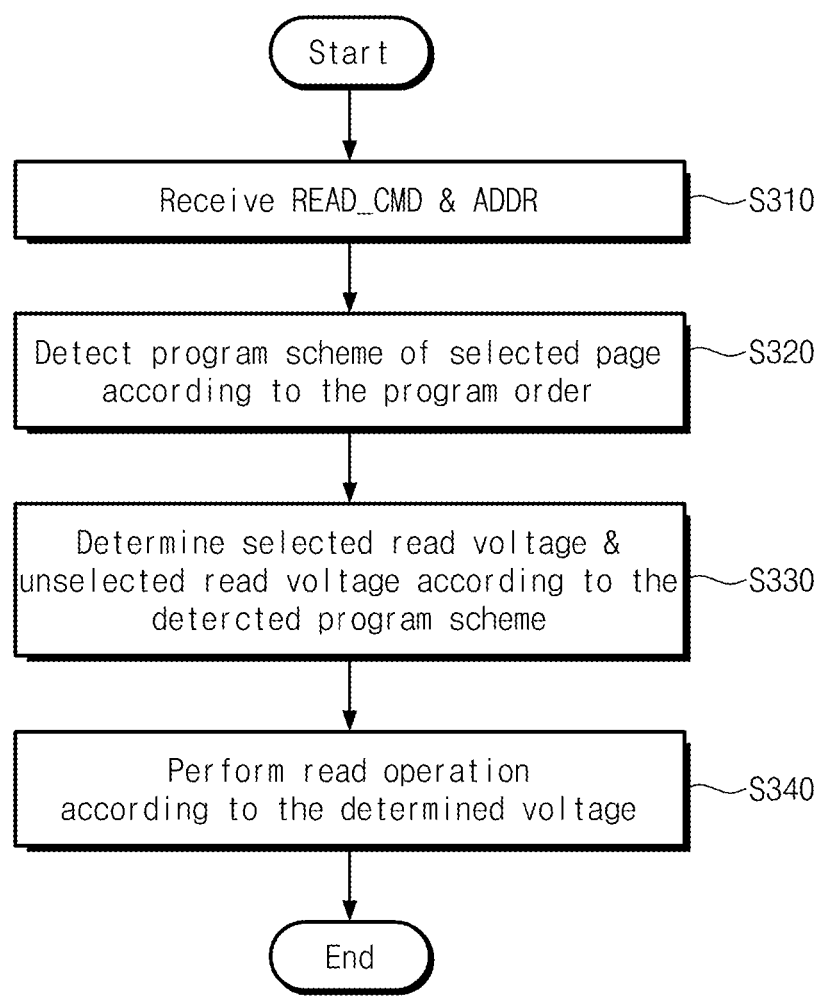
FIG. 19 is a flowchart illustrating a read operation according to an embodiment of the inventive concept.

FIG. 19 is a flowchart illustrating a read operation according to another embodiment of the inventive concept. For convenience, the program operation will be described in the context of nonvolatile memory device 100 as described above. However, the program operation can be performed in alternative contexts.

Referring to FIG. 19, in operation 3210, control logic 150 receives a read command READ_CMD and an address ADDR from an external device. Next, in operation S320, control logic 150 detects a programmed order of a page corresponding to the input address and detects a program scheme according to a programmed order of the page. For example, control logic 150 may detect a programmed order of a selected page according to a location of a string selection line of the selected page corresponding to the input address.

In operation S330, control logic 150 determines a selection read voltage and a non-selection read voltage according to a program scheme of the selected page. For example, where a programmed order of the selected page precedes a reference order, control logic 150 may control a voltage generator 120 such that selection and non-selection read voltages of the selected page are higher than selection and non-selection read voltages of other selected pages. In operation S340, a read operation is performed using the determined selection and non-selection read voltages.

As indicated by the description of FIGS. 18 and 19, nonvolatile memory device 100 may prevent a read fail by using different read schemes according to different program schemes.

Figure 20:
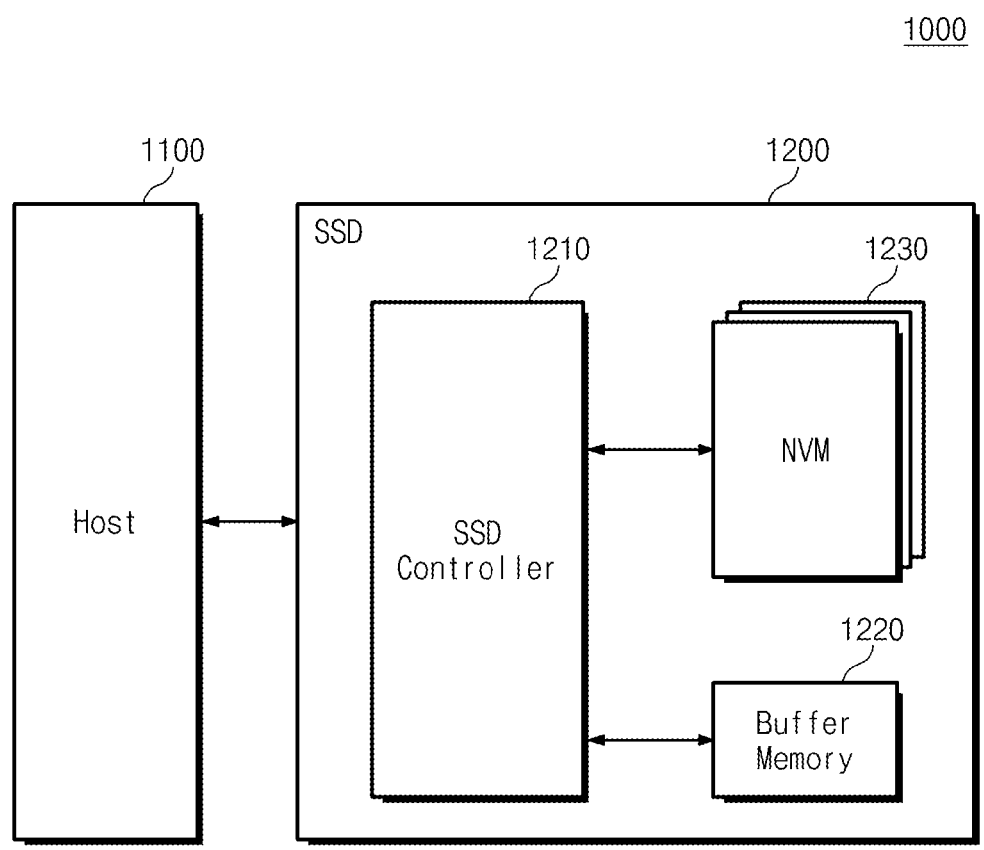
FIG. 20 is a block diagram of a system comprising a solid state drive according to an embodiment of the inventive concept.

FIG. 20 is a block diagram illustrating a system 1000 comprising a solid state drive (SSD) 1200 according to an embodiment of the inventive concept.

Referring to FIG. 20, system device 1000 comprises a host 1100 and SSD 1200. SSD 1200 comprises an SSD controller 1210, a buffer memory 1220, and a nonvolatile memory device 1230.

SSD controller 1210 provides a physical interconnection between host 1100 and SSD 1200. SSD controller 1210 typically provides an interface with SSD 1200 according to a bus format of host 1100. To perform memory access operations, SSD controller 1210 decodes a command provided from host 1100 and accesses nonvolatile memory device 1230 according to the decoded command. The bus format of host 1100 can be, for instance, Universal Serial Bus (USB), Small Computer System Interface (SCSI), peripheral component interconnect (PCI) express, advanced technology attachment (ATA), Parallel ATA (PATA), Serial ATA (SATA), or Serial Attached SCSI (SAS), for example.

Buffer memory 1220 temporarily stores write data provided from host 1100 or data read out from nonvolatile memory device 1230. Where data in nonvolatile memory device 1230 is cached at a read request of host 1100, buffer memory 1220 may support a cache function of providing cached data directly to host 1100. Typically, a data transfer speed of a bus format (e.g., SATA or SAS) of host 1100 may be higher than that of a memory channel of SSD 1200. A potential reduction in performance due to the speed difference may be minimized by providing buffer memory 1220 having a large storage capacity.

Buffer memory 1220 may be formed of a synchronous DRAM to provide sufficient buffering to SSD 1200 used as an auxiliary mass storage device. However, buffer memory 1220 is not limited to this example.

Nonvolatile memory device 1230 may be provided as a storage medium of SSD 1200. For example, nonvolatile memory device 1230 may be formed of a vertical NAND flash memory device having a mass storage capacity. Nonvolatile memory device 1230 may be formed of multiple memory devices. In this case, memory devices may be connected to SSD controller 1210 by a channel unit. Nonvolatile memory device 1230 may be formed of a NAND flash memory, for example. Alternatively, the storage medium of SSD 1200 can be formed of other types of nonvolatile memory, such as PRAM, MRAM, ReRAM, a FRAM, or NOR flash memory, or it can be formed of a combination of different types of memories. Nonvolatile memory device 1230 may be configured substantially the same as described in FIG. 1. In SSD controller 1200, nonvolatile memory device 1230 uses different program and read schemes according to a program sequence of pages sharing the same word line. This can allow SSD 1200 to prevent a read fail.

Figure 21:
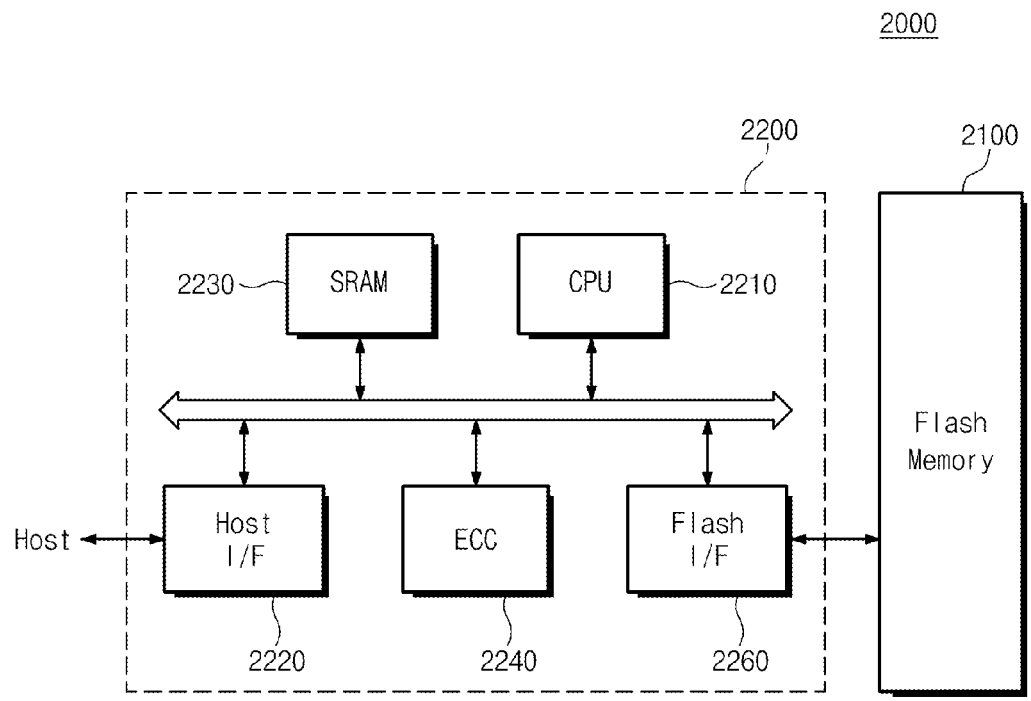
FIG. 21 is a block diagram of a memory system according to an embodiment of the inventive concept.

FIG. 21 is a block diagram of a memory system 2000 according to another embodiment of the inventive concept.

Referring to FIG. 21, memory system 2000 comprises a nonvolatile memory 2100 and a memory controller 2200. Nonvolatile memory 2100 is configured substantially the same as nonvolatile memory device 100 of FIG. 1.

Memory controller 2200 is configured to control nonvolatile memory 2100. An SRAM 2230 is used as a working memory of a CPU 2210. A host interface 2220 implements a data exchange protocol of a host connected with memory system 2000. An ECC block 2240 is configured to detect and correct errors included in data read out from nonvolatile memory 2100. A memory interface 2260 interfaces with nonvolatile memory 2100. CPU 2210 executes a control operation for data exchange of memory controller 2200. Although not shown in FIG. 21, memory system 2000 further comprises a ROM that stores code data for interfacing with the host.

Memory controller 2200 communicates with an external device (e.g., host) via one of interface protocols such as USB, MMC, PCI-E, SAS, SATA, PATA, SCSI, ESDI, IDE, and the like.

In memory system 2000, nonvolatile memory device 2100 uses different program and read schemes according to a program sequence of pages sharing the same word line. Thus, memory system 2000 may prevent a read fail.

Memory system 2000 can be incorporated in or integrated with various types of devices, such as, e.g., a computer, a portable computer, an Ultra Mobile PC (UMPC), a workstation, a net-book, a PDA, a web tablet, a wireless phone, a mobile phone, a smart phone, an e-book, a portable multimedia player (PMP), a digital camera, a digital audio recorder/player, a digital picture/video recorder/player, a portable game machine, a navigation system, a black box, a 3D television, a device capable of transmitting and receiving information in a wireless context, one of various electronic devices constituting home network, one of various electronic devices constituting computer network, one of various electronic devices constituting telematics network, RFID, or one of various electronic devices constituting a computing system.

Figure 22:
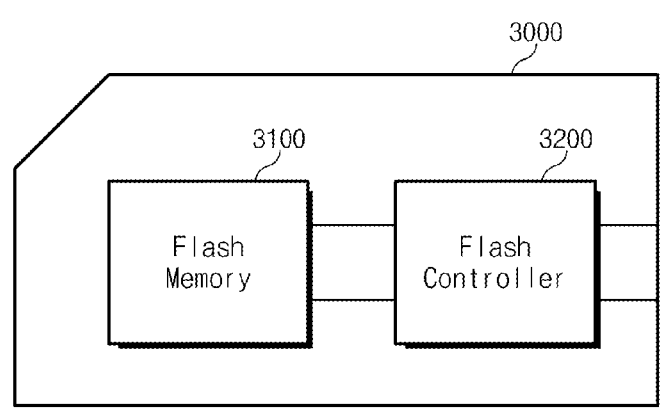
FIG. 22 is a block diagram of a data storage device according to an embodiment of the inventive concept.

FIG. 22 is a block diagram of a data storage device 3000 according to still another embodiment of the inventive concept.

Referring to FIG. 22, data storage device 3000 comprises a flash memory 3100 and a flash controller 3200. Flash controller 3200 controls flash memory 3100 in response to control signals input from the outside of data storage device 3000.

Flash memory 3100 is configured substantially the same as nonvolatile memory device 100 of FIG. 1. Accordingly, it may use different program and read schemes according to a program sequence of pages sharing the same word line, which may prevent a read fail.

Data storage device 3000 can be, for instance, a memory card device, an SSD device, a multimedia card device, an SD device, a memory stick device, a HDD device, a hybrid drive device, or a USB flash device. For example, data storage device 3000 may be a card that satisfies a standard for a user device such as a digital camera, a personal computer, and the like.

Figure 23:
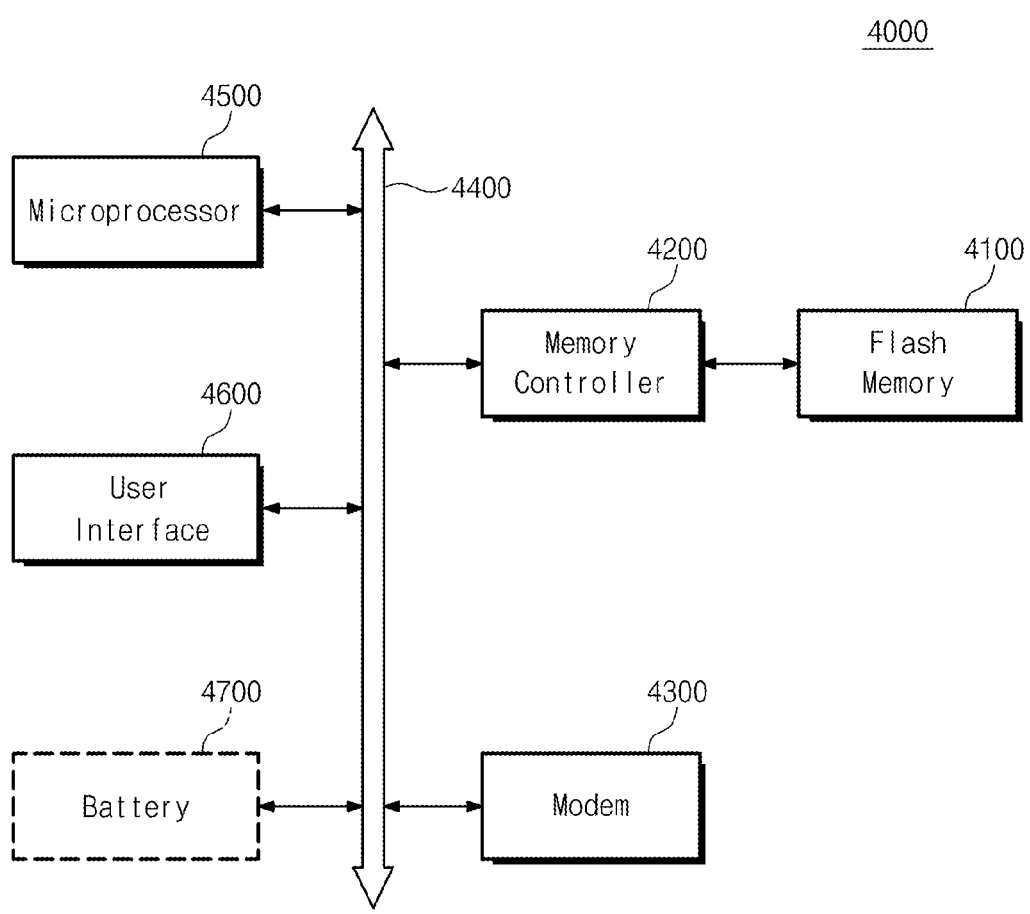
FIG. 23 is a block diagram of a computing system comprising a flash memory device according to an embodiment of the inventive concept.

FIG. 23 is a block diagram illustrating a computing system 4000 comprising a flash memory device according to an embodiment of the inventive concept.

Referring to FIG. 23, computing system 4000 comprises a flash memory device 4100, a memory controller 4200, a modem 4300 such as a baseband chipset, a microprocessor 4500, and a user interface 4600. Elements 4200, 4300, 4500, and 4600 may be electrically connected to a bus 4400.

Flash memory device 4100 is configured substantially the same as described with reference to FIG. 1. That is, flash memory device 4100 may use different program and read schemes according to a program sequence of pages sharing the same word line. Thus, data storage device 2000 may prevent a read fail.

Where computing system 4000 is a mobile device, it may further comprise a battery 4700 as a power supply. Although not shown in FIG. 19, computing system 4000 may further comprise an application chipset, a camera image processor (CIS), a mobile DRAM, and the like. Memory controller 4200 and flash memory device 4100 may constitute a solid state drive/disk (SSD) which uses a nonvolatile memory to store data.

The above-described nonvolatile memory devices, memory controllers, and/or other features may be packaged in any of various types of packages or package configurations, such as, e.g., Package on Package (PoP), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of operating a nonvolatile memory device comprising cell strings formed in a direction substantially perpendicular to a substrate and configured to select memory cells in units corresponding to a string selection line, the method comprising:
    selecting a page to be programmed among pages sharing a common word line;
    determining a level of a program voltage to be provided to the selected page according to a location of the string selection line corresponding to the selected page; and
    writing data in the selected page using the determined level of the program voltage.

2. The method of claim 1, wherein determining the level of the program voltage to be provided to the selected page comprises:
    comparing the location of the string selection line of the selected page with a location of a reference string selection line; and
    determining a level of the program voltage to be provided to the selected page by determining whether the selected page is programmed in a first part of a reference order.

3. The method of claim 2, wherein determining whether the selected page is programmed in the first part of the reference order comprises determining whether the location of the string selection line of the selected page precedes the location of the reference string selection line.

4. The method of claim 3, wherein where the selected page is programmed in the first part of the reference order, an increment of a program voltage to be provided to a word line corresponding to the selected page is set to be lower than an increment of a predetermined program voltage.

5. The method of claim 4, wherein where the selected page is programmed in the first part of the reference order, a level of a pass voltage to be provided to an unselected word line is set to be lower than a level of a predetermined pass voltage.

6. The method of claim 4, wherein where the selected page is programmed in the first part of the reference order, a level of a start program voltage among program voltages to be provided to the selected word line is set to be higher than a level of a predetermined start program voltage.

7. The method of claim 3, wherein where the selected page is programmed after the first part of the reference order, a level of a verification read voltage to be provided to the selected word line is set to be higher than a level of a predetermined verification read voltage.

* * * * *